(12) United States Patent  (10) Patent No.: US 7,692,952 B2
DeHon  (45) Date of Patent: Apr. 6, 2010

(54) NANOSCALE WIRE CODING FOR STOCHASTIC ASSEMBLY

(75) Inventor: André DeHon, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1625 days.

(21) Appl. No.: 10/925,863

(22) Filed: Aug. 24, 2004

(65) Prior Publication Data

US 2008/0062735 A1 Mar. 13, 2008

Related U.S. Application Data

(60) Provisional application No. 60/499,177, filed on Aug. 28, 2003.

(51) Int. Cl.
*G11C 8/00* (2006.01)
*G11C 8/02* (2006.01)
*G11C 8/10* (2006.01)

(52) U.S. Cl. .................. 365/151; 365/230.06; 365/231; 257/E29.07; 438/962; 977/762; 977/764; 977/767; 977/943

(58) Field of Classification Search .................... 257/12, 257/202, 204, 28, E29.07; 365/151, 189.16, 365/230.06, 231; 977/762, 764, 767, 943; 438/962
See application file for complete search history.

(56) References Cited

U.S. PATENT DOCUMENTS 5,349,558 A 9/1994 Cleveland et al. ........... 365/200
6,128,214 A 10/2000 Kuekes et al. ............... 364/151
6,256,767 B1 7/2001 Kuekes et al. ................ 716/9
6,314,019 B1 11/2001 Kuekes et al. ............... 365/151
6,383,784 B1 5/2002 Smith ........................ 435/91.2
6,473,351 B2 10/2002 Tomanek et al. ............ 365/215
6,682,951 B1 1/2004 Lutz
6,706,402 B2 3/2004 Rueckes et al.
6,777,982 B2 8/2004 Goldstein et al. ........... 326/134
6,900,479 B2 5/2005 DeHon et al.
6,952,358 B2 * 10/2005 Snider ...................... 365/49.17
6,963,077 B2 11/2005 DeHon et al.
2002/0027819 A1 3/2002 Tomanek et al. ............ 365/215
2002/0175390 A1 11/2002 Goldstein et al. ........... 257/481
2003/0089899 A1 5/2003 Lieber et al. ................... 257/9

(Continued)

FOREIGN PATENT DOCUMENTS

WO 02/103753 A2 12/2002

(Continued)

OTHER PUBLICATIONS

Ahlskog, M. et al., "Single-electron transistor made of two crossing multiwalled carbon nanotubes and its noise properties," Appl. Phys. Lett., vol. 22, No. 24, Dec. 11, 2000, pp. 4037-4039.

(Continued)

*Primary Examiner*—J. H. Hur
(74) *Attorney, Agent, or Firm*—Steinfl & Bruno

(57) ABSTRACT

Methods for obtaining codes to be implemented in coding nanoscale wires are described. The methods show how to code a reduced number of nanoscale wires through the use of rotation group codes. The methods further show how to generate different code permutations through random misalignment and how to promote uniform code probability selection.

6 Claims, 18 Drawing Sheets

U.S. PATENT DOCUMENTS

| | | | |
|---|---|---|---|
| 2003/0200521 A1 | 10/2003 | DeHon et al. | 716/16 |
| 2003/0206436 A1 | 11/2003 | Eaton, Jr. et al. | 365/177 |
| 2004/0113138 A1 | 6/2004 | DeHon et al. | 257/9 |
| 2004/0113139 A1 | 6/2004 | DeHon et al. | 257/9 |
| 2005/0017234 A1 | 1/2005 | DeHon et al. | |

FOREIGN PATENT DOCUMENTS

| | | |
|---|---|---|
| WO | 03/063208 A2 | 7/2003 |
| WO | 2004/034467 A2 | 4/2004 |
| WO | 2004/061859 A2 | 7/2004 |

OTHER PUBLICATIONS

International Written Opinion for the corresponding PCT Application No. PCT Application No. PCT/US03/01555, issued on Jun. 30, 2005 (7 pages).

U.S. Appl. No. 10/853,907, filed May 25, 2004, DeHon et al.

U.S. Appl. No. 10/856,115, filed May 28, 2004, Dehon et al.

Albrecht, O., et al., "Construction and Use of LB Deposition Machines for Pilot Production," *Thin Solid Films*, vol. 284-285, pp. 152-156 (Sep. 15, 1996).

Björk, M.T., et al., "One-Dimensional Steeplechase for Electrons Realized," *Nano Letters*, vol. 2, No. 2, pp. 87-89 (2002).

Brown, C.L., et al., "Introduction of [2]Catenanes Into Langmuir Films and Langmuir-Blodgett Multilayers. A Possible Strategy for Molecular Information Storage Materials," *Langmuir*, vol. 16, No. 4, pp. 1924-1930 (2000).

Chen, Y., et al., "Nanoscale Molecular-Switch Crossbar Circuits," *Institute of Physics Publishing*, Nanotechnology 14, pp. 462-468 (2003).

Chen, Y., et al., "Self-Assembled Growth of Epitaxial Erbium Disilicide Nanowires on Silicon (001)," *Applied Physics Letters*, vol. 76, No. 2, pp. 4004-4006 (Jun. 26, 2000).

Chou, S.Y., "Sub-10 nm Imprint Lithography and Applications," *J. Vac. Sci. Technol. B*, vol. 15, No. 6, pp. 2897-2904 (Nov./Dec. 1997).

Collier, C.P., et al., "A [2]Catenane-Based Solid State Electronically Reconfigurable Switch," *Science*, vol. 289, pp. 1172-1175 (Aug. 18, 2000).

Collier, C.P., et al., "Electronically Configurable Molecular-Based Logic Gates," Science, vol. 285, pp. 391-394 (Jul. 16, 1999).

Cui, Y., et al., "Diameter-Controlled Synthesis of Single-Crystal Silicon Nanowires," *Applied Physics Letters*, vol. 78, No. 15, pp. 2214-2216 (Apr. 9, 2001).

Cui, Y., et al., "Doping and Electrical Transport in Silicon Nanowires," *The Journal of Physical Chemistry*, vol. 104, No. 22, pp. 5213-5216 (Jun. 8, 2000).

Cui, Y., et al., "Functional Nanoscale Electronic Devices Assembled Using Silicon Nanowire Building Blocks," *Science*, vol. 291, pp. 851-853 (Feb. 2, 2001).

Dehon, A., "Array Based Architecture for FET-Based, Nanoscale Electronics," *IEEE Transactions on Nanotechnology*, vol. 2, No. 1, pp. 23-32 (Mar. 2003).

Dekker, C., "Carbon Nanotubes As Molecular Quantum Wires," *Physics Today*, pp. 22-28 (May 1999).

Derycke, V., et al., "Carbon Nanotube Inter- and Intramolecular Logic Gates," *Nano Letters*, vol. 1, No. 9, pp. 453-456 (Sep. 2001).

Goldstein, S.C., et al., "NanoFabrics: Spatial Computing Using Molecular Electronics," *Proc. Of The 28th Annual International Symposium on Computer Architecture*, pp. 1-12 (Jun. 2001).

Gudiksen, M.S., et al., "Growth of Nanowire Superlattice Structures for Nanoscale Photonics and Electronics," *Nature*, vol. 415, pp. 617-620 (Feb. 7, 2002).

Huang, Y., et al., "Directed Assembly of One-Dimensional Nanostructures Into Functional Networks," *Science*, vol. 291, pp. 630-633 (Jan. 26, 2001).

Huang, Y., et al., "Logic Gates and Computation From Assembled Nanowire Building Blocks," *Science*, vol. 294, pp. 1313-1317 (Nov. 9, 2001).

Lauhon, L.J., et al., "Epitaxial Core-Shell and Core-Multishell Nanowire Heterostructures," *Nature*, vol. 420, pp. 57-61 (Nov. 7, 2002).

Lieber, C.M., "Nanowire Superlattices," *Nano Letters*, vol. 2, No. 2, pp. 81-82 (Feb. 2002).

Morales, A.M., et al., "A Laser Ablation Method for the Sythesis of Crystalline Semiconductor Nanowires," *Science*, vol. 279, pp. 208-211 (Jan. 9, 1998).

Tans, S.J., et al., "Room-Temperature Transitor Based On A Single Carbon Nanotube," *Nature*, vol. 393, pp. 49-52 (May 7, 1998).

Ulman, A., "Part Two: Langmuir-Blodgett Films," *An Introduction to Ultrathin Organic Films*, Section 2.1, pp. 101-132 (1991).

Whang, D., et al., "Nanolithography Using Hierarchically Assembled Nanowire Masks," *Nano Letters*, vol. 3, No. 7, pp. 951-954 (2003).

Wu, Y., et al., "Block-by-Block Growth of Single-Crystaline Si/SiGe Superlattice Nanowires," *Nano Letters*, vol. 2, No. 2, pp. 83-86 (2002).

Ziegler, M. M., et al., "CMOS/NANO Co-Design for Crossbar-based Molecular Electronics Systems" *IEEE Transactions on Nanotechnology*, vol. 2, No. 4, pp. 217-230 (Dec. 4, 2004).

\* cited by examiner

NANOSCALE WIRE CODING FOR STOCHASTIC ASSEMBLY

CROSS REFERENCE TO RELATED APPLICATIONS

This application claims the benefit of U.S. provisional Patent Application, Ser. No. 60/499,177, filed Aug. 28, 2003 for "Implementation of Computation Note 23: k-Hot Rotation Groups" by Andre' DeHon. This patent application is also related to U.S. patent application Ser. No. 10/627,405 filed Jul. 24, 2003 for "Stochastic Assembly of Sublithographic Nanoscale Interfaces" by Andre' DeHon, Charles M. Lieber, Patrick D. Lincoln, John E. Savage, the entire contents of which applications are herein incorporated by reference in their entirety.

STATEMENT REGARDING FEDERALLY SPONSORED RESEARCH OR DEVELOPMENT

The present invention was made with support from the U.S. Government under Grant number N00014-01-0651 awarded by the Office of Naval Research of the Department of the Navy, and Grant CCR-0210225 awarded by the National Science Foundation. The United States Government has certain rights in the invention.

BACKGROUND OF THE INVENTION

1. Field of the Invention

The present invention relates to the field of sublithographic fabrication of electronic circuits. More specifically, methods and apparatus for controlling electric conduction on nanoscale wires from both lithographic wires and nanoscale wires are disclosed, such as a stochastic assembly of sublithographic nanoscale interfaces and a sublithographic nanoscale memory architecture. In particular, nanoscale wire coding for stochastic assembly is disclosed.

2. Description of the Prior Art

Technologies to build nanoscale crosspoints are already known. FIG. 1 is a schematic cross-sectional view which shows a suspended prior art nanotube conductor 1 coupled to a plurality of lower carbon nanotube or silicon nanoscale wire conductors 2, 3, and 4 separated by a plurality of supports 5. The supports are made of a dielectric material, such as silicon dioxide. In this way, a nanotube-nanotube (or nanotube-nanoscale wire) junction is formed. The junction is bistable with an energy barrier between the two states. In one state, see tubes 1-2 and 1-4, the tubes are "far" apart and mechanical forces keep the top wire 1 from descending to the lower wire 2, 4. At this distance the tunneling current between the crossed conductors is small, resulting, effectively, in a very high resistance (GigaOhms) between the conductors. In the second state, see tubes 1-3, the tubes come into contact or near contact and are held together via molecular forces. In this state, there is little resistance (about 100 KΩ) between the tubes. By applying a voltage between tubes, one can charge them to the same or opposite polarities and use electrical charge attraction/repulsion to cross the energy gap of the junction between the two bi-stable states, effectively setting or resetting the programming of the connection. These junctions can be rectifying such that the connected state exhibits PN-diode rectification behavior. Molecular electronics PN-junctions are disclosed, for example, in Y. Cui and C. M. Lieber, "Functional Nanoscale Electronic Devices Assembled using Silicon Nanoscale wire Building Blocks," Science 291, 851-853 (2001).

Techniques for storing non-volatile memory bits at the crosspoints of a nanoscale wire array are already known in the art. See, for example, C. P. Collier, E. W. Wong, M. Belohradsky, F. M. Raymo, J. F. Stoddard, P. J. Kuekes, R. S. Williams, and J. R. Heath, "Electronically configurable molecular-based logic gates," Science, vol. 285, pp. 391-394, 1999. Bits can typically be programmed by placing a large voltage across individual crosspoint junctions. The status of each crosspoint is read by observing the current flowing through a junction. Programmed "ON" junctions will act as low resistance paths, while programmed "OFF" junctions will act as high resistance paths.

Also known in the prior art is how doped silicon nanoscale wires can exhibit Field-Effect Transistor (FET) behavior. FIG. 2 is a schematic perspective view of a prior art embodiment which shows oxide 10 grown over a silicon nanoscale wire 11 to prevent direct electrical contact of a crossed conductor 12, for example a carbon nanotube or a silicon nanoscale wire. The electrical field of one wire can then be used to "gate" the other wire, locally evacuating a region of the doped silicon nanoscale wire of carriers to prevent conduction. FET resistance varies from Ohms to GigaOhms. Similarly, also carbon nanotubes can exhibit FET behavior. See, for example, Yu Huang, Xiangfeng Duan, Yi Cui, Lincoln Lauhon, Kevin Kim and Charles M. Lieber, "Logic Gates and Computation from Assembled Nanoscale wire Building Blocks," Science, 2001, v294, p 1313-1317, V. Derycke, R. Martel, J. Appenzeller and Ph. Avouris, "Carbon Nanotube Inter-and Intramolecular Logic Gates," Nano Letters, 2001, v1n9, p 435-456, and Sander J. Trans, Alwin R. M. Verschueren and Cees Dekker, "Room-temperature Transistor Based on a Single Carbon Nanotube," Nature, 1998, v393, p 49-51, May 7.

The doping profile or material composition along the axial dimension of a nanoscale wire can be controlled, as shown in Mark S. Gudiksen, Lincoln J. Lauhon, Jianfang Wang, David C. Smith, and Charles M. Lieber, "Growth of nanowire superlattice structures for nanoscale photonics and electronics," Nature, v415 p 617-620, February 2002, Yiying Wu, Rong Fan, and Peidong Yang, "Block-by-block growth of single-crystalline Si/SiGe superlattice nanowires," Nano Letters, v2 n2, p 83-86, February 2002, and M. T. Bjork, B. J. Ohlsson, T. Sass, A. I. Persson, C. Thelander, M. H. Magnusson, K. Depper, L. R. Wallenberg, and L. Samuelson, "One-dimensional steeplechase for electrons realized," Nano Letters, v2 n2, p 87-89, February 2002.

Furthermore, regular arrangements of nanoscale wires (parallel arrays of wires, crossed, orthogonal structures) are also known. A crossbar is usually defined as an array of switches that connect each wire in one set of parallel wires to every member of a second set of parallel wires that intersects the first set. Generally, the two sets of wires are perpendicular to each other. In the "on" position the switch connects the horizontal wire to the vertical wire, while in the "off" position the two wires remain disconnected. As a consequence, it is possible to store the switch state and implement switching in the area of a crosspoint. That is, the switch device itself holds its state. Therefore, crossbars in this technology can be fully populated with no cost in density. This is particularly beneficial in achieving the necessary defect tolerance. See, for example, U.S. Pat. No. 6,256,767 to Kuekes, Williams and Stanley.

Further, non-volatile memories can be built which are as tight as the nanoscale (sublithographic) wire pitch. See, for example, U.S. Pat. No. 6,128,214 to Kuekes, Williams, Stanley and Heath.

However, in order to program or read these crosspoint, a way to apply a control voltage to an individual nanoscale wire and to selectively read from a single nanoscale wire is needed. Therefore, a critical weak link in the construction of fully nanoscale memory and logic arrays is the construction of an interface that allows one to individually address the nanoscale wires from the microscale wires.

A scheme for bridging the microscale-nanoscale gap with a decoder based on randomly deposited gold nanoparticles has been disclosed in U.S. Pat. No. 6,256,767 cited above. The gold particles must be deposited over the region in which control and address wires intersect. This prior art approach relies on close control of the density of deposited particles, ideally targeting half of the points of intersection. Additionally, the approach relies on strongly quantized connection values for each intersection, while imprecisely localized gold nanoparticles could lead to intermediate values that complicate the discovery of wires that are connected. Consequently, the prior art approach comes with its own set of manufacturing challenges.

Therefore, a better way to individually address the nanoscale wires is needed. The present disclosure shows devices and methods able to control single nanoscale wires individually, wherein control is performed both at the microscale level and at the nanoscale level, so that individual crosspoints can be programmed and addressed.

Throughout the present disclosure, the term micron-scale (also microscale) will refer to dimensions that range from about 0.1 micrometer to about 2 micrometers in size. The term nanometer-scale (also nanoscale) will refer to dimensions that range from 0.1 nanometers to 50 nanometers (0.05 micrometer), the preferred range being from 0.5 nanometers to 5 nanometers.

SUMMARY OF THE INVENTION

According to a first aspect, a method to code nanoscale wires is disclosed, comprising: providing a plurality of nanoscale wires, each nanoscale wire comprising a number n of potentially controllable regions axially distributed along the nanoscale wire; selecting a number k<n of regions to be controlled within the number n of potentially controllable regions; generating a group comprising permutations of the k regions to be controlled; dividing the group in subgroups, each subgroup consisting of permutations of the k regions which are a rotation of each other, so that all permutations of a given subgroup can be obtained by rotation of any one of the permutations of the given subgroup; and for each subgroup, selecting a permutation within the subgroup, wherein the selected permutations are different therebetween and represent different codings; and using the selected permutations to code the plurality of nanoscale wires.

According to a second aspect, a method to code nanoscale wires is disclosed, comprising: providing a plurality of nanoscale wires, each nanoscale wire comprising a number n of potentially controllable regions axially distributed along the nanoscale wire; selecting a number k<n of regions to be controlled within the number n of potentially controllable regions; generating a first group comprising permutations of the k regions to be controlled; selecting a first permutation within the first group; determining, within remaining permutations of the first group, which are the remaining permutations which can be obtained by rotation of the selected permutation; eliminating from the first group the selected permutation and the determined permutations, thus forming a second group; performing, on the second group, the same operations performed on the first group, thus selecting a second permutation and forming a third group; and repeating actions of selecting, determining and eliminating, until no further permutations can be selected, wherein the selected permutations are different therebetween and represent different codings; and using the selected permutations to code the plurality of nanoscale wires.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Modulation Doping

Figure 3:
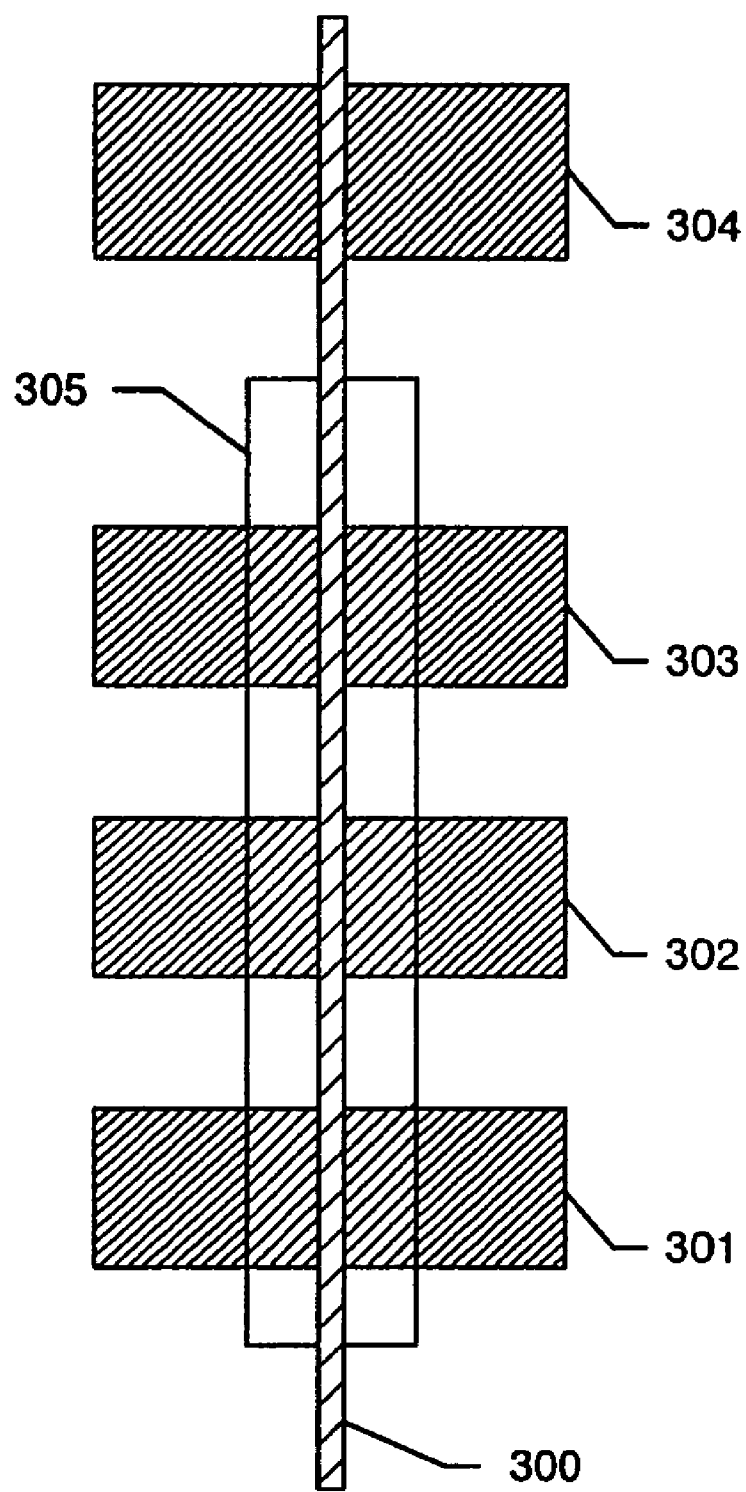
FIG. 3 shows an elementary module of a nanoscale combining logic.

Doped nanoscale wires act as Field-Effect-Transistors (FETs), as disclosed in Yu Huang, Xiangfeng Duan, Yi Cui, Lincoln Lauhon, Kevin Kim and Charles M. Lieber, "Logic Gates and Computation from Assembled Nanowire Building Blocks," Science, 2001, v294, p 1313-1317. In particular, conduction along the length of a nanoscale wire can be controlled by an applied voltage field. For the depletion-mode p-type devices demonstrated to date, a low voltage (or no applied voltage) will allow good conduction, whereas a high applied voltage will evacuate carriers from the doped semiconductor preventing conduction along the nanoscale wire length. In this way, a combining logic can be built where several conductors cross a doped nanoscale wire, as shown in FIG. 3. In particular, FIG. 3 shows a nanoscale wire 300 crossing microscale control wires 301-303 and microscale ohmic contact 304 to a source voltage. Also shown is an oxide layer 305, which separates the nanoscale wire from the microscale wires. If all the inputs on the control microwires 301-303 are low, there is a conduction path from one side of the crossed nanoscale wire 300 to the other. If any of the inputs 301-303 are high, there will be no conduction path.

Also n-type nanowires can be manufactured. N-type nanowires would conduct only when the applied field has a voltage higher than a designated threshold, while low voltages would turn off conduction. Therefore, also in this case, a combining logic is provided. In this case, the control gates would have opposite polarity as in the p-type nanowires, so that all control inputs along an n-type nanowire should be high for conduction to occur.

Another way of decorating nanoscale wires is that of providing regions made of different materials. M. T. Björk, B. J. Ohlsson, T. Sass, A. I. Persson, C. Thelander, M. H. Magnusson, K. Depper, L. R. Wallenberg, and L. Samuelson, "One-dimensional steeplechase for electrons realized," Nano Letters, v2, n2, pp 87-89, February 2002, describe and demonstrate a nanowire heterostructure alternating bands of InAs and InP. InAs and InP have different conduction properties (e.g. different conduction thresholds). Yiying Wu, Rong Fan, and Peidong Yang, "Block-by-block growth of single-crystalline Si/SiGe superlattice nanowires," Nano Letters, v2, n2, pp 83-86, similarly show a banded heterostructure alternating Si and SiGe regions.

As already explained in the introductory section of the present application, it is already known how to control the doping profile or material composition along the axial dimension of a nanoscale wire.

Therefore, a silicon nanoscale wire can have different conducting thresholds as a function of the length along the nanoscale wire. The technique for controlling the doping profile of a nanoscale wire is called modulation doping. By controlling the doping profile the threshold voltage for the FET can be effectively controlled. That is, with high doping, it becomes very hard to deplete the carriers from the channel and stop conduction through the wire; consequently, the threshold voltage is high. With low doping, there are fewer carriers, allowing a low voltage to deplete the channel and stop conduction. Therefore, wires which are gateable in some regions but not gateable in others can be constructed. The growth along the length of the nanoscale wire is controlled by time. The nanoscale wire crystal grows by incorporating new atoms into its lattice at one end. To control the dopant profile, the dopant concentration in the nanoscale wire's growth environment is controlled over time. Consequently, the width of each doping region can be precisely controlled by controlling the rate of the growth reaction and the introduction of dopants into the growth atmosphere at the appropriate times. The dimensions of the doping regions are thus defined completely without lithographic processing.

Figure 4:
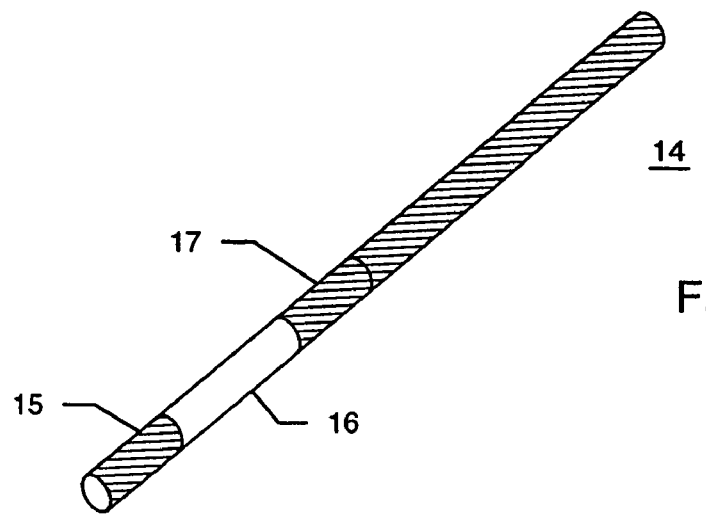
FIG. 4 shows a modulation-doped silicon nanoscale wire.

FIG. 4 shows a modulation-doped silicon nanoscale wire 14 having three different regions 15, 16, and 17. Regions 15 and 17 are doped more strongly than region 16. Regions 15 and 17 are non-FET controlled regions. Region 16 is a FET controlled region. As a consequence, regions 15 and 17 conduct for a range of voltages which is wider than the range of voltages for which regions 16 conduct. For example, regions 15 and 17 can conduct for any applied voltage between 0 and 5V, and regions 16 can conduct for any applied voltage between 0 and 1V.

Modulation doping allows an address to be built into a nanoscale wire. Assuming that the nanoscale wires are depletion mode p-doped silicon nanoscale wires, current flows with no or low voltage applied, and the current flow can be stopped by applying a voltage which is higher than a threshold for a given doping. In case of n-doped silicon nanoscale wires, current flow when voltage higher than a certain threshold is applied, and the current flow can be stopped by applying a voltage which is lower than that threshold. The present disclosure develops an addressing scheme, where a plurality of microscale or nanoscale wires controls a plurality of nanoscale wires to allow selection of a nanoscale wire among the plurality of nanoscale wires.

With the ability to decorate nanoscale wires, for example by means of modulation doping, code words can be assigned to nanoscale wires. Each nanoscale wire is segmented into regions that are doped as either FET-controllable or non-controllable. When a coded nanoscale wire is aligned across a set of microscale wires, the flow of current through the nanoscale wire can be controlled. If a suitably low field is applied on all the FET-controlled regions, the nanoscale wire will conduct. If a high field is applied on any of the FET-controlled regions, the nanoscale wire will not conduct. Applying a high field on the non-FET controlled regions will not affect conduction. In one embodiment, the controlling voltages are provided by control microwires, which are at right angles to the addressed nanoscale wires. Therefore, address regions on a nanoscale wire can be differentiated from other regions on the nanoscale wire by controlling the voltages used in each region.

Figure 5:
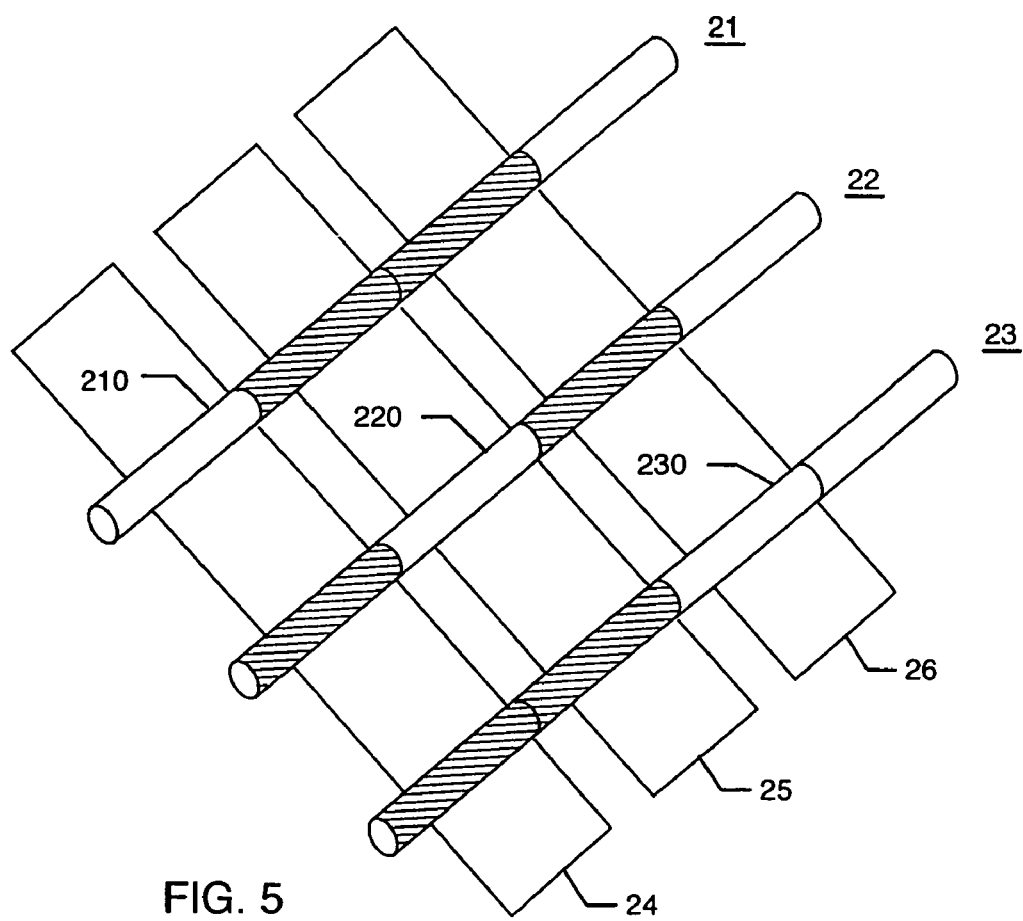
FIG. 5 shows a scheme for addressing nanowires.

FIG. 5 shows an example of a scheme for addressing p-doped nanoscale wires, where nanoscale wires 21, 22 and 23 each comprise a low threshold doped region, 210, 220, and 230, respectively. Also shown in the figure are addressing lines 24, 25, and 26. If line 24 is driven with a low voltage and lines 25 and 26 are driven with a high voltage, nanoscale wire 21 will be selected. In particular, low-voltage driving line 24 will maintain the conducting state of nanoscale wire 21, thus selecting nanoscale wire 21, and high-voltage driving lines 25 and 26 will interrupt conduction of nanoscale wires 22 and 23 because the regions 220 and 230 will not conduct anymore due to the presence of a high voltage over the other two regions on these wires. Similarly, if line 25 is driven with a low voltage and lines 24 and 26 are driven with a high voltage, nanoscale wire 22 will be selected and nanoscale wires 21, 23 will be deselected. Finally, if line 26 is driven with a low voltage and lines 24 and 25 are driven with a high voltage, nanoscale wire 23 will be selected and nanoscale wires 21, 22 will be deselected. A similar scheme can be adopted for n-doped nanoscale wires.

A scheme for controlling a nanoscale wire will be called k-hot if a nanoscale wire has n potentially controllable regions, k of which are built to be controllable. In the provisional application No. 60/441,995 incorporated by reference to the present application, applicants have shown that in a k=n/2-hot scheme, to uniquely address N nanoscale wires, no more than n=1.1 $\log_2(N)+3$ address bits are needed. Consequently, for large enough arrays, the overhead associated with control lines becomes small compared to the size of the nanoscale logic or memory core it addresses. The overhead remains modest even if k-hot addressing is used with k much smaller than n/2.

In U.S. patent application Ser. No. 10/627,406, the contents of which are herein incorporated by reference in their entirety, it has been shown that nanoscale wires (instead of the microscale wires 24-26) are provided to control the nanoscale wires, thus providing a fully nanoscale system. For example, nanowire outputs from a nanowire array like the one disclosed in U.S. patent application Ser. No. 10/347,121, the contents of which are herein incorporated by reference in their entirety, can be used as the control/address inputs to the decoders according to the present disclosure.

Stochastic Assembly

A problem with nanoscale wires is that they can be assembled at a tight pitch, which is too small to allow selection of an individual nanowire by direct connection to lithographic wires. However, it is currently possible to assemble undifferentiated nanoscale wires into orthogonal sets of parallel wires. For example, in U.S. patent application Ser. No. 10/627,406, it has been shown that nanoscale wires coded in accordance with the modulation technique shown in FIGS. 4 and 5 and described above are first mixed together to produce a random ordering of coded nanowires and then assembled into sets of parallel wires; as a result the set of wires in a given array is selected stochastically. In the provisional application No. 60/398,943 filed on Jul. 25, 2002, applicants have shown that stochastic selection of coded nanoscale wires from a sufficiently large ensemble of such nanoscale wires ensures that almost all codes are unique. For example, a code space of $10^6$ different codes can be considered, where the number of wires having the same code is $10^6$ (or $10^{12}$ total wires), and the goal is that of building a small array with 10 wires in it. If each wire is selected randomly from the $10^{12}$ total wires, there is over a 99.995% chance that all 10 wires are unique. There is an even higher likelihood to get at least 9 unique wires. Therefore, coded wires can be randomly selected to obtain the desired independent nanoscale addressability, thus overcoming the need for deterministic selection of the nanoscale wires to include in a particular array.

It should be noted that fabrication of $10^{12}$ coded nanoscale wires consumes a lot of resources and time. The present disclosure shows a method of cutting down the number of coded nanoscale wires that need to be fabricated for a stochastic addressing scheme. According to the disclosed method, an n-bit code will need a number of wires as codes which is about 1/n-th the number of wires as codes to be used in absence of such method.

The applicants have shown how to relate C and the number of nanoscale wires in an array (N) to the probability of achieving various uniqueness and distinctiveness guarantees, as shown, for example, in the provisional application No. 60/441,995 filed on Jan. 23, 2003.

For example, the applicants have shown that a code space $C=100 \times N^2$ is sufficient to yield almost all unique codes; the chance of not achieving unique codes being at most 1%. Depending on the application, other code selection criteria may be important. Smaller code spaces can be achieved if a higher probability of non-unique codes is permitted. Similarly, if a few of the codes are allowed to be replicated, the probability of finding an acceptable collection can be high even with a smaller code space. The aforementioned analysis guarantees there are no duplicates. A separate analysis, also provided by the applicants, see provisional application No. 60/429,010, allows one to calculate the relationship between C, N, and d, where d is the number of distinct codes appearing in the collection of N wires allowing duplication. Using this selection criteria, it is possible to show that $d>0.5\times N$ when $C=N$ for typical array sizes (e.g. $N=10$ to $N=1000$).

Therefore, according to the present disclosure, the nanoscale wires to be controlled comprise a unique sequence of regions or a uniquely addressable set of sequences of regions. If all the nanoscale wires are k-hot, then the unique sequence will be uniquely addressable.

The applicants have also shown that the number of control wires controlling the plurality of nanoscale wires is less than C, for example $O(\log(N))$ or $O(\sqrt[k]{N})$ for any desirable $k>=1$.

Therefore, the present disclosure shows a method of uniquely addressing a single nanoscale wire in a plurality of nanoscale wires by providing each nanoscale wire with controllable regions axially distributed along the nanoscale wire, establishing a subset of nanoscale wires to be controlled by stochastically selecting the subset from the plurality of nanoscale wires, and selecting the single nanoscale wire among the subset of nanoscale wires by either controlling or not controlling the controllable regions on nanoscale wires of the subset of nanoscale wires.

Alternatively, all nanoscale wires or none of the nanoscale wires of the subset can be selected, by selecting addresses which connect them all to the supply or disconnect them all from the supply.

Alignment

The dimensional alignment between microscale wires and nanoscale wires shown in FIG. 5 is ideal. In practice, there may be no way of perfectly aligning the nanoscale wires with each other. Regardless of how the nanoscale wires are misaligned, they can be thought of as being misaligned by multiples of the width of the control microscale wires (the control bit pitch) and by fractions of such bit pitch. Therefore, every misalignment can be seen as a combination between a 'multiple' and a 'fraction' misalignment.

Misalignment by Multiples of the Control Bit Pitch

When the controlling microscale wires and the nanoscale wires are misaligned by multiples of the control bit pitch, one or more of the control microscale wires would not "cross" any portion of the corresponding "1" or "0"-doped region of the nanoscale wire if nothing were done to mitigate against this misalignment.

Figure 6:
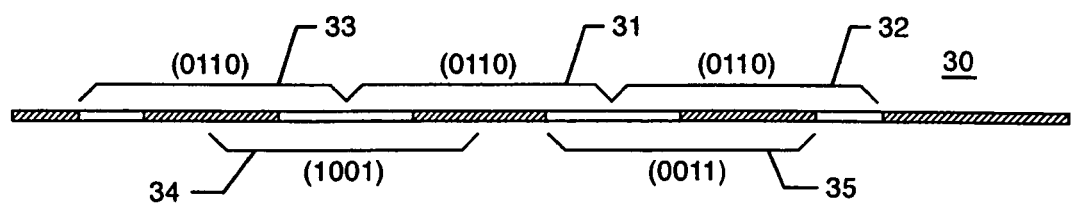
FIG. 6 shows a modulation-doped nanoscale wire with concatenated multiple copies of a code.

A first way of addressing this problem is that of repeating the code multiple times along the entire length of the nanoscale wire. FIG. 6 shows a nanoscale wire 30 carrying an n-bit n/2-hot code. In the example of FIG. 6, multiple copies 31, 32 of the base code have 33 been concatenated on the nanoscale wire 30. With a four-bit code, four microscale wires will be needed to address all the relevant bits on the nanoscale wires. Once the code is repeated along the nanoscale wire, every microscale wire will always be able to address a bit position on the nanoscale wire. A random misalignment between microscale wires and nanoscale wires can cause offset codes, different from the base code (0110) 33 to be selected, such as codes 34 or 35. However, this alternative selection is acceptable, because such offset codes (1001) or (0011) are a rotation of the base code (0110) 33. In other words, code 34 (1001) is the base code 33 (0110) shifted twice to the right and code 35 (0011) is the base code 33 (0110) shifted one time to the right. This alternative selection is also acceptable because such offset codes (1001) or (0011) are still valid codes in the 2-hot code space of the present example.

However, coding along the entire length has the effect that extra control regions are located in places where there is no desire of controlling the nanoscale wire, such as the core of the memory array, so that a crossing line might unintentionally disable the nanoscale wire.

In some application, this may not matter. When the nanowire core is radially doped (see the 'Radial Modulation Doping' section disclosed below in the present application), the radial structure may be sufficient to protect the conduction in the core silicon from being turned off. In these cases, the address ends are exposed by an in-place etch after they have been assembled into the array. Thus only the intended address region has its radial structure removed and is directly exposed for control.

It may also be possible to avoid the unintentional turn-off effect by using lower operating voltages inside the memory as compared to the address control. If the operating voltage inside the memory is always below the threshold of the control regions, then the wires will always conduct inside the memory. The address control lines, which exist only outside of the memory, can then be driven to higher voltages, i.e. voltages which do exceed the threshold (Vctrl high>Vmoddope threshold >Vmemory high), so that they can control conduction.

An alternate way of addressing the problem which avoids raising the address control voltages is that of acting on the nanoscale wires by first masking off the area on the nanoscale wire where the microscale wires should be (addressing region), leaving exposed the portions of the nanoscale wires that are not in the addressing region, and then doing a bulk doping phase of the regions outside of the addressing region because of the masking, i.e. the only regions to be bulk-doped will be the regions not acting as addressing regions. In this way the addressing region will be self-aligned because only the addressing region will be controllable.

Figure 7:
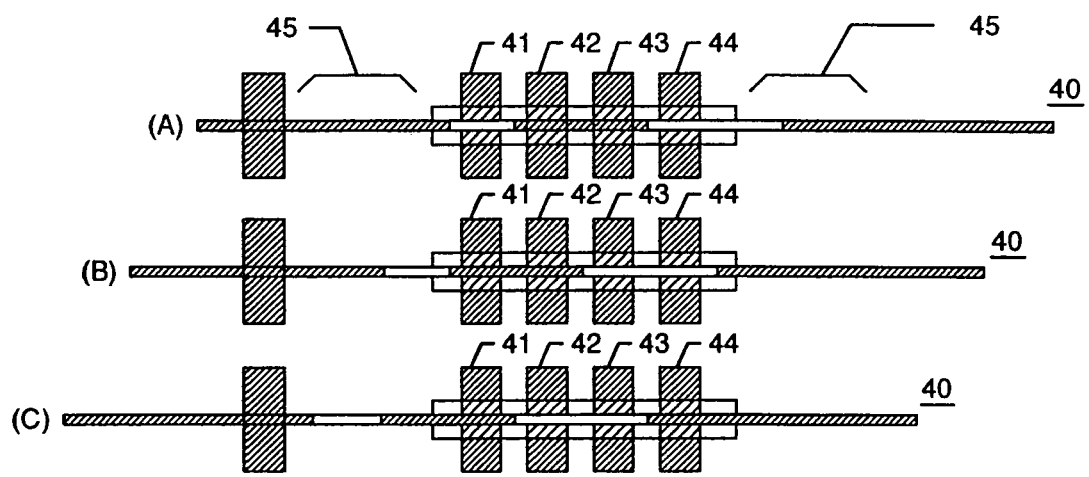
FIGS. 7(A)-7(C) show a modulation-doped nanoscale wire with a partially repeated code.

A third way of addressing the problem is to partially repeat the code (or a fraction thereof) for a distance equal to the expected misalignment. This is shown in FIGS. 7(A)-7(C), which all show a nanoscale wire with a partial repeat of 2 bits to tolerate a +/−1 bit displacement . This means that the last two bits of the 0110 code are repeated at the left of the code, and the first two bits of the 0110 code are repeated at the right of the code. FIG. 7(A) shows a case where there is no misalignment and the code 0110 is controlled by the microscale wires 41-44. FIG. 7(A) also shows the extension of the alignment guard region 45. FIG. 7(B) shows a case where the code on the nanoscale wire 40 is moved one bit position to the left, and the code 1100 is controlled by the microscale wires 41-44. FIG. 7(C) shows a case where the code on the nanoscale wire is moved two bit positions to the left, and the code 1001 is controlled by the microscale wires 41-44. Once again, offset codes (1100) in FIG. 7(B) or (1001) in FIG. 7(C) are a rotation of the base code (0110) in FIG. 7(A), that is code (1001) is the base code (0110) shifted twice to the right and code (0011) is the base code (0110) shifted one time to the right. In this third addressing method, the fact that the nanoscale wire 40 conducts across a coded region when there is no field applied is exploited. In this way, the controllable bit code regions which end up on either side of the control microscale wires 41-44 will continue to allow signal conduction.

Misalignment by Fractions of the Bit Pitch

In order for a microscale wire to control a coded region of a nanoscale wire, there must be a sufficient overlap between the field of the microscale wire and the doped, controllable region of the nanoscale wire.

Figure 8:
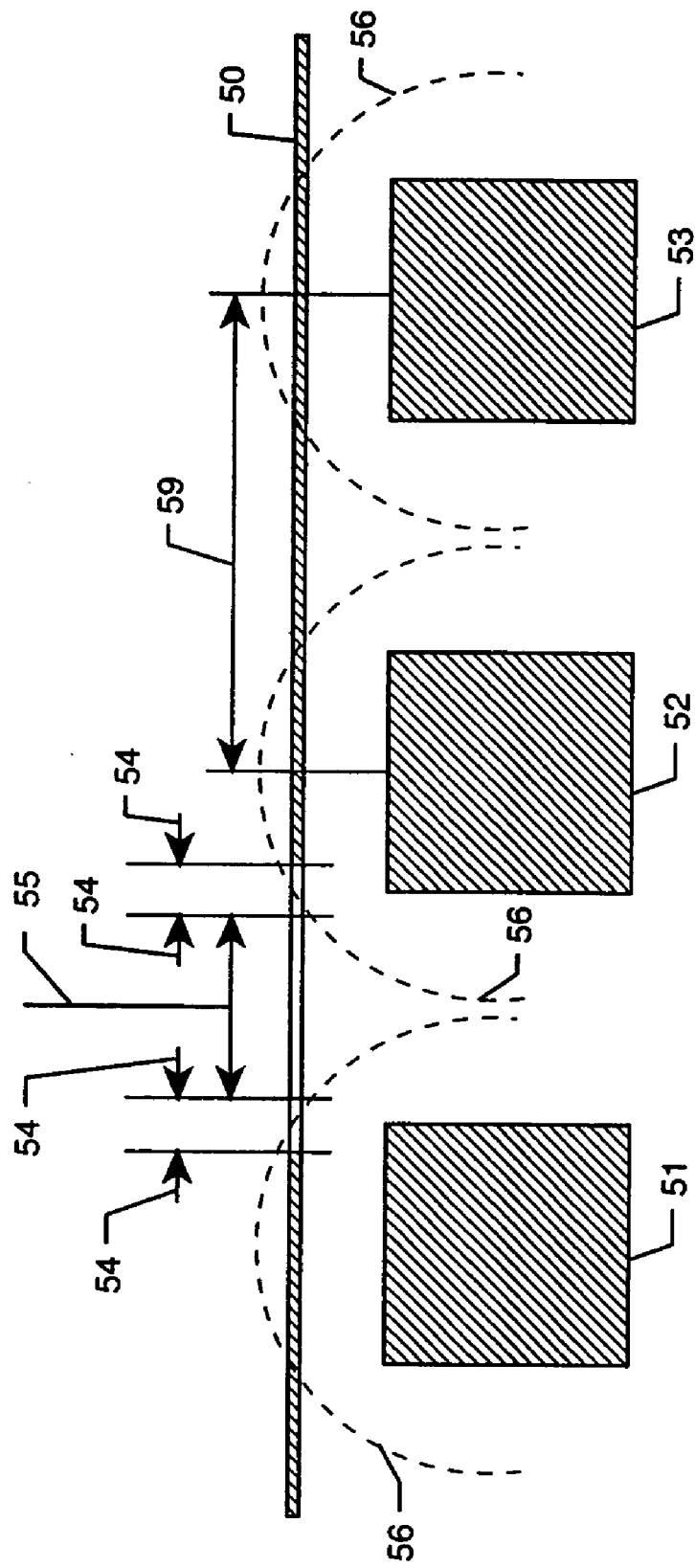
FIG. 8 shows a cross-sectional view of a microscale-nanoscale arrangement.

FIG. 8 shows a cross sectional view of three microscale wires 51-53 and a nanoscale wire 50 above the microscale wires 51-53. In order to stop conduction on the depletion-mode nanoscale wire 50, carriers have to be depleted only in a small region along the axis of the nanoscale wire 50, probably an overlap region 54 (Woverlap) less than 5 nm, i.e. less than the order of a diameter or two of the nanoscale wire 50. The extent of the region Woverlap depends on the domain of influence 56 of the microscale wire field. Therefore, overlap regions having an extension between 0 and Woverlap may not work, because they may only partially turn off conductions, resulting in intermediate current flow levels. FIG. 8 shows a non-controllable region 55 between the fields of adjacent microscale control wires, such as microscale wires 51 and 52. In the preferred embodiment according to the present invention, the length of the doped, controllable region is equal to the length of the non-controllable region of the nanoscale wire plus 2×Woverlap. In this way, the presence of a region under one of the adjacent control fields having a length which is at least Woverlap is always guaranteed, so that the region will be controlled either by the left or the right adjacent microscale wire. There is an undesired chance, of course, that a region having a length between 0 and Woverlap is disposed both over the left and the right adjacent microscale wire. The probability for this to occur can be made small, typically less than 10%.

Therefore, the misalignment between the control wires and regions on the nanoscale wires associated with the control wires by a distance less than a width of the microscale wires is tolerated by engineering or designing the length or profile of the controllable region.

FIG. 8 shows an example where the controllable region overlaps two fields. When the controllable region overlaps multiple fields, no code in the normal k-hot address space will enable conduction along the nanowire. This is good because it guarantees that misaligned nanowires will, at least, not interfere with the operation of the correctly aligned nanowires.

Using codes outside of the normal k-hot code space may still allow the wire to be addressed. For example, a misaligned 1100 code may have its third position controlled by both the second and third wire, and its fourth position controlled by both the third and fourth wire. A 1000 address (i.e. an address outside the 2-hot code space) will select this wire and can be used if there is no 1100 and no 1001 code in the array. However, if either 1100 or 1001 are present in the array, it will not be possible to select such 1000 wire without also selecting on of the other codes. Consequently, for most applications the preferred embodiment will simply treat these wires as non-accessible.

Use of Nanowires for Address Control

In a different embodiment, nanoscale wires are provided to control the nanoscale wires, thus providing a fully nanoscale system, as already explained above. This is useful when the addresses to the decoder come from nanoscale circuitry, such as a nanoPLA.

Figure 9:
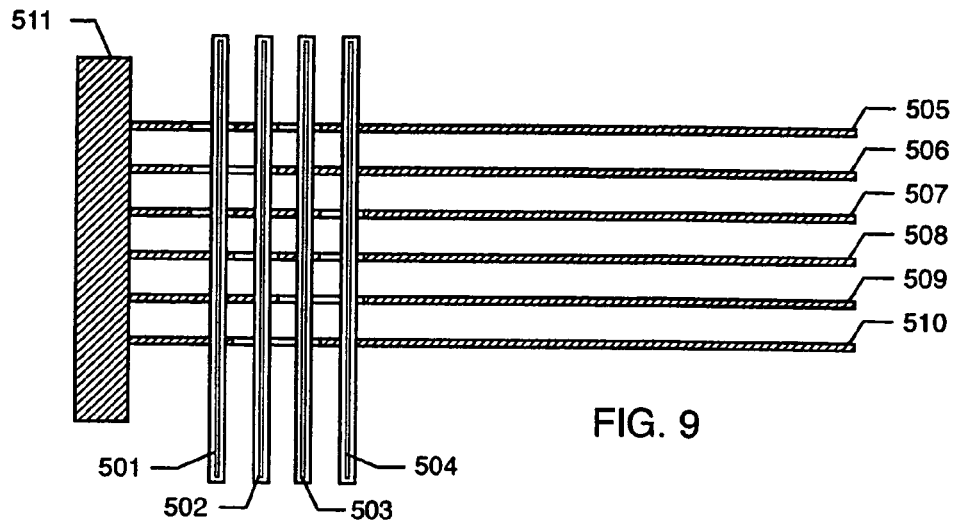
FIGS. 9 and 10A-10D show an embodiment where a first set of nanoscale wires is used to control a second set of nanoscale wires.

FIG. 9 shows this embodiment, where oxide coated nanowires 501-504 control a plurality of nanowires 505-510. The nanowires 505-510 are connected to an ohmic contact 511 to a source, not shown in the Figure. Oxide separation between the two sets of nanowires is obtained by means of an oxide shell around the control wires, as also shown in the figure. Alternatively, oxide separation can be obtained with lithographic definition and growth between the first layer of nanowires and the second layer of nanowires, or with an oxide shell around the nanowires 505-510 covering the control region area, i.e. the area crossed by the control nanowires 501-504.

It should be noted that, in the embodiment of FIG. 9, the width of the control wire pitch is the same spacing as the nanowire pitch (Wbitpitch), so that the control overlap region Woverlap should be roughly the same size as Wbitpitch. This may require an alignment strategy which is different from that shown in FIGS. 6-8.

A first step is that of guaranteeing that the coded region of the nanoscale wires 505-510 is at least Wbitpitch+ 2*Woverlap<2*Wbitpitch. In this way, every coded region will always be controlled by some nanoscale wire.

Additionally, control regions on the nanowires 505-510 are spaced at twice the ordinary spacing, i.e. two physical bit positions, and twice as many control nanowires are used. Even with this added amount of control nanowires, the number of control wires remains logarithmic in the number of wires in the decoder.

Figure 10A:
Figure 10B:
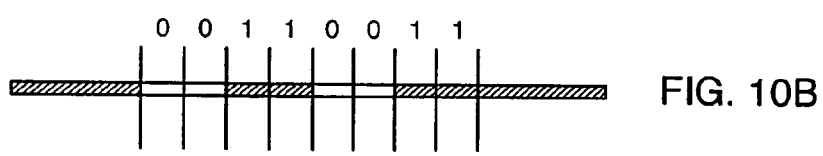
Figure 10C:
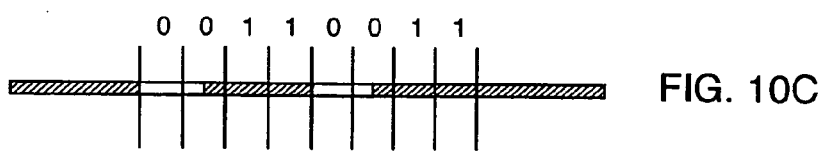

FIGS. 10A-10C show this embodiment with more clarity. FIG. 10A shows the original coding, where the vertical lines show the bit regions and line spacing, and are one bit pitch apart. FIG. 10B shows an example where double coding has been performed and the length of the coded region is exactly 2 bit pitches. FIG. 10C shows another example, where the length of the coded region is just under 2 bit pitches, but at least Wbitpitch+2*Woverlap, in accordance with the expression above.

Figure 10D:
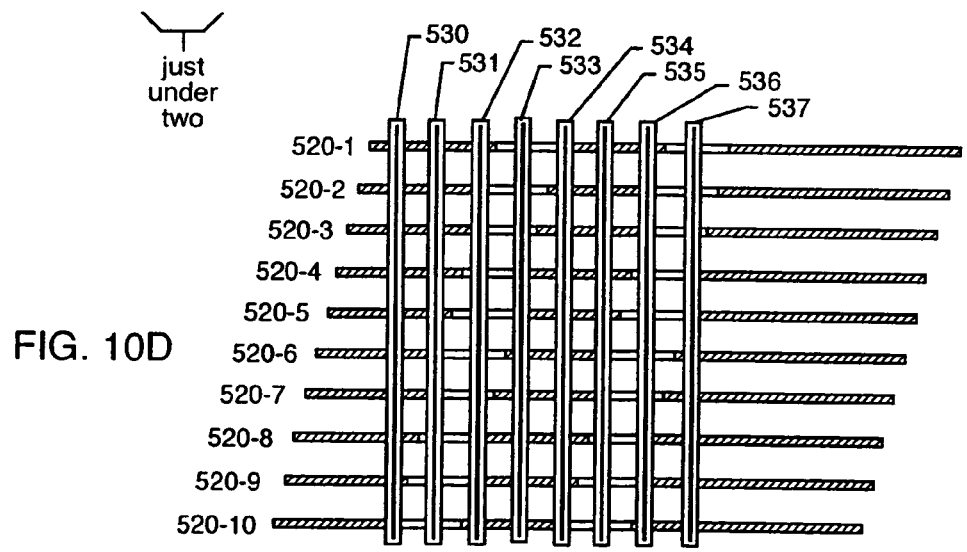

FIG. 10D shows ten offsets 520-1 . . . 520-10 of the same nanowire 520, where each control region satisfies the expression above. Each of the offset lines will be enabled according to the following table

| | |
|---|---|
| 520-1 | 11100110 |
| 520-2 | 11001100 |
| 520-3 | 11001100 |
| 520-4 | 11001100 |
| 520-5 | 11001100 |
| 520-6 | 10011001 |
| 520-7 | 10011001 |
| 520-8 | 10011001 |
| 520-9 | 10011001 |
| 520-10 | 00110011 |

It can be noted that the first five offsets can be addressed with the code 01000100, the following four offsets can be addressed with the code 10001000 (i.e. the previous 01000100 code with a 1-bit rotation) and the final offset with the code 00010001 (i.e. another bit rotation from the previous code). Therefore, the present invention discloses a method for addressing nanowires by means of control nanowires according to the following steps:

1) providing the nanowires to be controlled with coded regions having a length Wbitpitch+2*Woverlap<2*Wbitpitch
2) Doubling the coding on the nanowires to be controlled, i.e. spacing the control regions on the nanowires to be controlled at twice the ordinary spacing
3) Using a code on the control nanowires where "11" occurrences in the code of the nanowire to be controlled are replaced by "01" or "10" and also providing codes which are a rotation of that code.

Memory Application

A programmable memory is also provided, addressed by means of the above disclosed decoder. Techniques for placing non-volatile memory bits at the crosspoints of a nanoscale wire array are already known in the art, as already mentioned in the background section of the present application.

Nanoscale Memory Array

Figure 11:
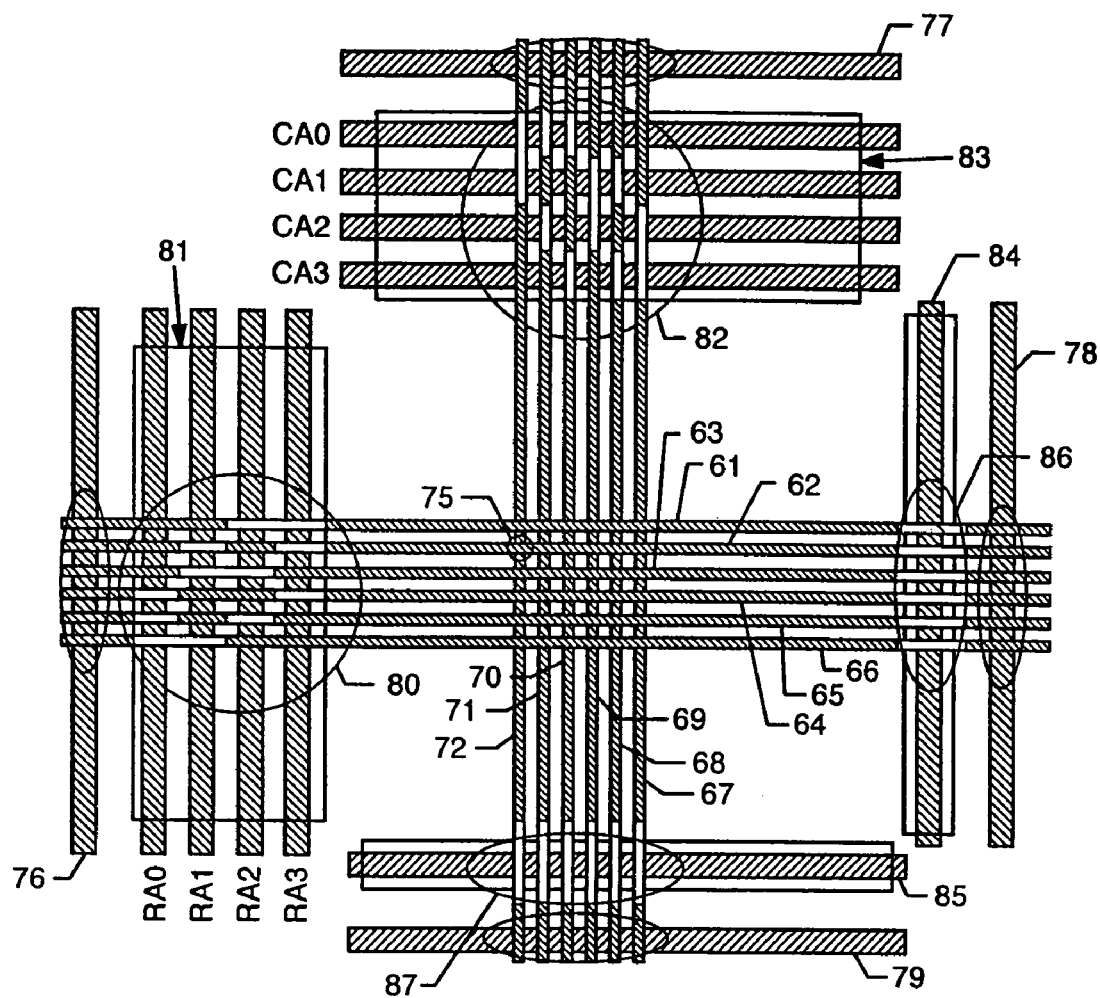
FIG. 11 shows a nanoscale memory array interfaced using address decoders formed by decorated nanoscale wires.

FIG. 11 shows a nanoscale memory array interfaced using modulation-doped address decoders shown with only a few nanoscale wires for clarity. In particular, an array of 6×6 nanoscale wires is shown. A typical array size would have 100-1000 nanoscale wires addressed by only 24-30 microscale wires.

FIG. 11 shows addressable row nanoscale wires 61-66 and addressable column nanoscale wires 67-72. Using these addressable nanoscale wires, exactly one row nanoscale wire, such as nanoscale wire 62, and one column nanoscale wire, such as nanoscale wire 72 can be enabled, so that a programming voltage can be applied across a single crosspoint, such as crosspoint 75. Row programming voltage is provided by ohmic contact 76, while column programming voltage is provided by ohmic contact 77. Ohmic contacts 78 and 79 will provide row and column nominal voltages, respectively.

Therefore, crosspoint 75 will have both its row nanoscale wire 62 and column nanoscale wire 72 pulled to the programming voltage, thus showing a greater voltage differential than other crosspoints where only one or none of the nanoscale wires are pulled to the programming voltage. The crosspoints can also be arranged to act as diodes to avoid parasitic paths in a partially programmed array.

In the writing phase, selection of the row nanoscale wire 62 occurs by means of the modulation-doped decoder 80, comprising row microscale wires RA0-RA3 and the modulation-doped regions of the nanoscale wires 61-66, separated from the microscale wires RA0-RA3 through an oxide layer 81. Selection of the column nanoscale wire 72 occurs by means of the modulation-doped decoder 82, comprising column microscale wires CA0-CA3 and the modulation-doped regions of the nanoscale wires 67-72, separated from the microscale wires CA0-CA3 through an oxide layer 83. Therefore, the addressing wires allow a memory location to be set into one of a plurality of states.

In the reading phase, data bits are read by placing appropriate control bits to enable only a single row and column. A high voltage is placed on the common column line 77, and the voltage on the common row line 76 is observed. In this manner, only the intended crosspoint, for example crosspoint 75, sees both a high input on its column line 77 and a low resistance path to the common row line 76. If the crosspoint is programmed "ON", it will be possible to observe the current flowing out of the selected row line, perhaps raising the row line voltage. If the crosspoint is programmed "OFF", there will be less current flow.

With the simple read operation described, the read operation can become slow for large arrays. In particular, the diode memory points can couple a column read line (one of columns 62-72) to every row line (lines 61-66), forcing the column line to charge all rows in order to read a single bit. In this way, the read time will scale as the product of the number of rows and columns rather than the sum.

To avoid the above worst-case coupling capacitance for read operations, it is possible to make the read time scale as sum of the row and column lines rather than the product. All the row lines 61-66 are first precharged to the high read voltage. This is one of the advantages of having an address that selects all the nanowires simultaneously. The row lines can be driven in parallel, so that the precharge time takes no more time than the time for charging a single row line. After that, the single row line that has to be read, is discharged. Then, the read operation is performed as before. Now, the row lines associated with bits which do not have to be read are already charged high and will not need to be charged while driving the intended row line.

The memory array also comprises microscale wires 84, 85 allowing the nominal row or column voltage to be disconnected, respectively. In particular, both microscale wires 84 and 85 comprise a FET controllable region 86, 87, allowing such voltage to be disconnected.

Hybrid Control Memory

A drawback of the memory described above is that it requires a very large address space and hence requires a very large collection of differently coded nanoscale wires. For example, in the case of a 500×500 array, a code space of 25million nanoscale wires would be required.

However, a more modest number of nanoscale wires can be used by means of a hybrid control scheme, where a set of nanoscale wires is first selected by a microscale wire ohmic contact without use of a modulation-doped decoder, and then the selected set of nanoscale wires is addressed by microscale wires, as shown in FIG. 12-15.

Figure 12:
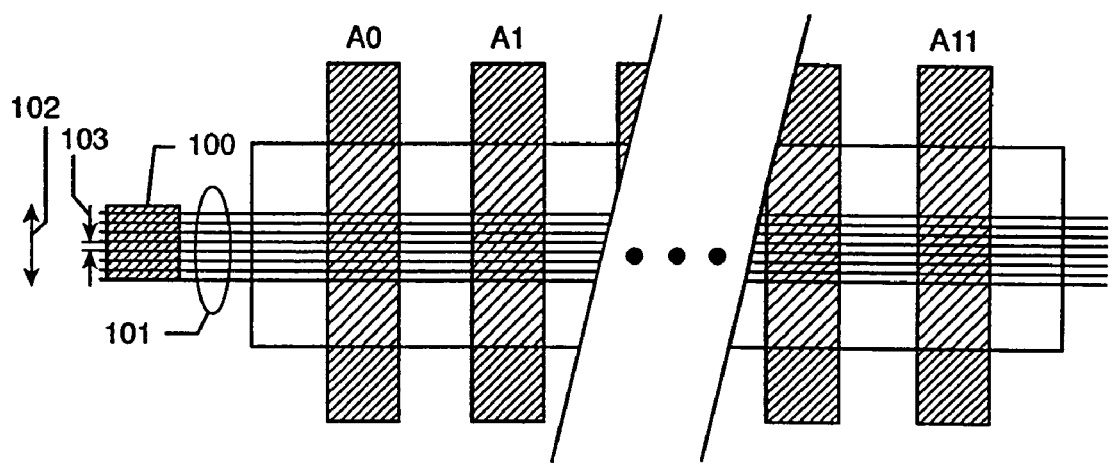
FIG. 12 shows a hybrid control memory arrangement.

In FIG. 12, an ohmic contact 100 selectively energizes the endpoints of a collection of nanoscale wires 101 at the lithographic scale. If the ohmic contact 100 has a width 102 of 90 nm and the nanoscale wires have a width 103 of 10 nm, the ohmic contact will be able to uniquely address a group of 9 nanoscale wires. Such nanoscale wires could then be addressed by a 12-bit code through the twelve microscale wires A0 . . . A11. In particular, a 6-hot, 12-bit code has 942 code words. With 942 code words, there is over a 96% probability that all 9 wires in a bundle will have unique codes.

A problem with this embodiment is the microscale wire pitch, i.e. the necessary minimum distance between the microscale wires, see, for example, element 59 in FIG. 8. The present invention addresses such problem by means of the embodiment of FIG. 13, where staggered adjacent microscale wire contacts 110-112 are provided. By staggering adjacent microscale wire contacts, the tight nanoscale wire pitch can be maintained, perhaps losing not more than one wire at the edge of each microscale wire group.

Figure 14:
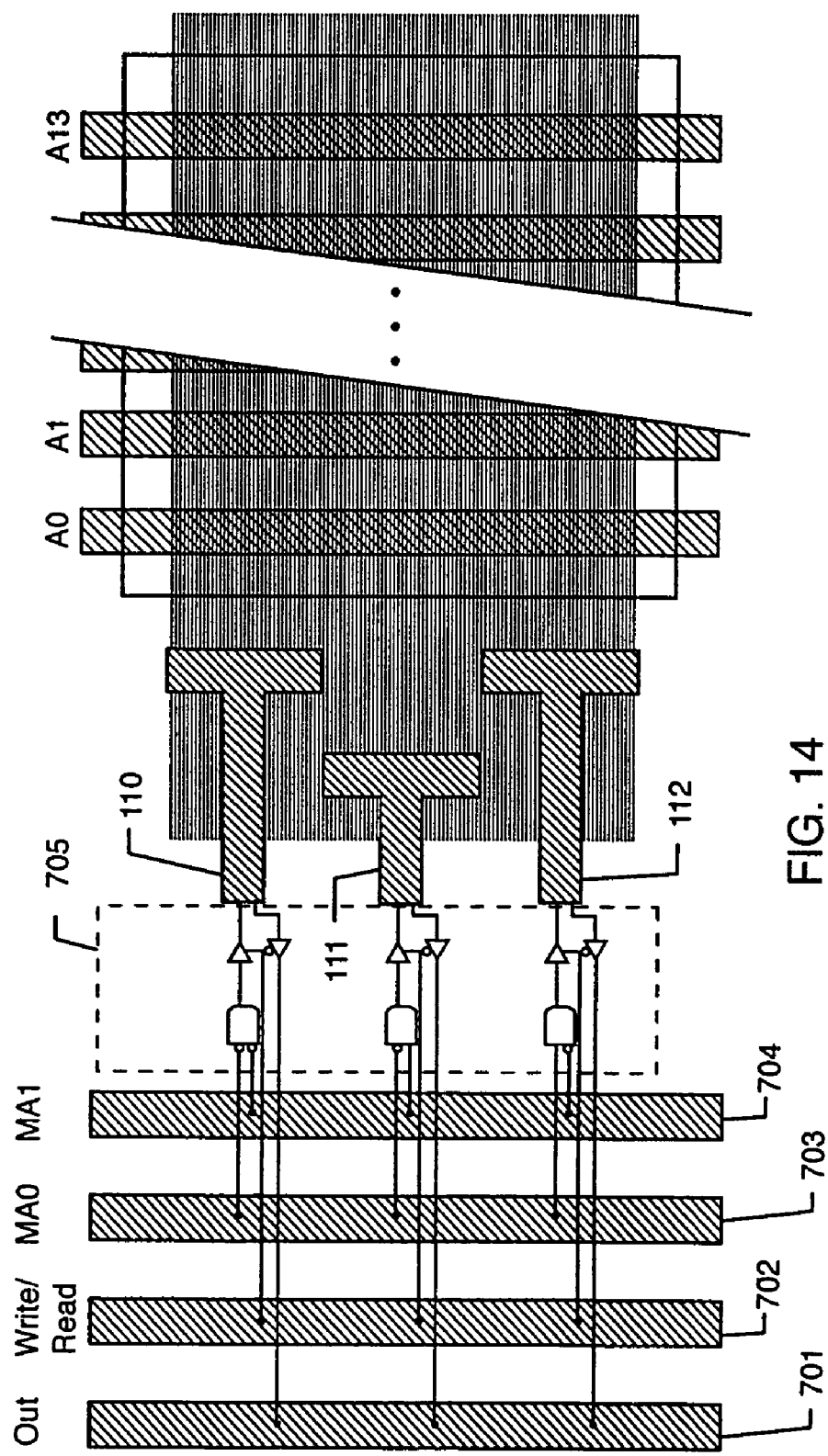
FIGS. 14 and 15 show methods of interfacing staggered ohmic contacts with microscale wires.

FIG. 14 shows a first embodiment for controlling staggered ohmic contacts, where four microscale wires 701-704 and an interface logic 705 are provided. Microscale wire 702 controls whether the operation is a write operation or a read operation, thus allowing communication either to the ohmic contacts or from the ohmic contacts. If the operation is a read operation, the signal is read on the output wire 701. The contacts 110-112 are selected by means of the wires 703, 704. Usually, N contacts will require $\log_2 N$ selection wires.

Figure 15:
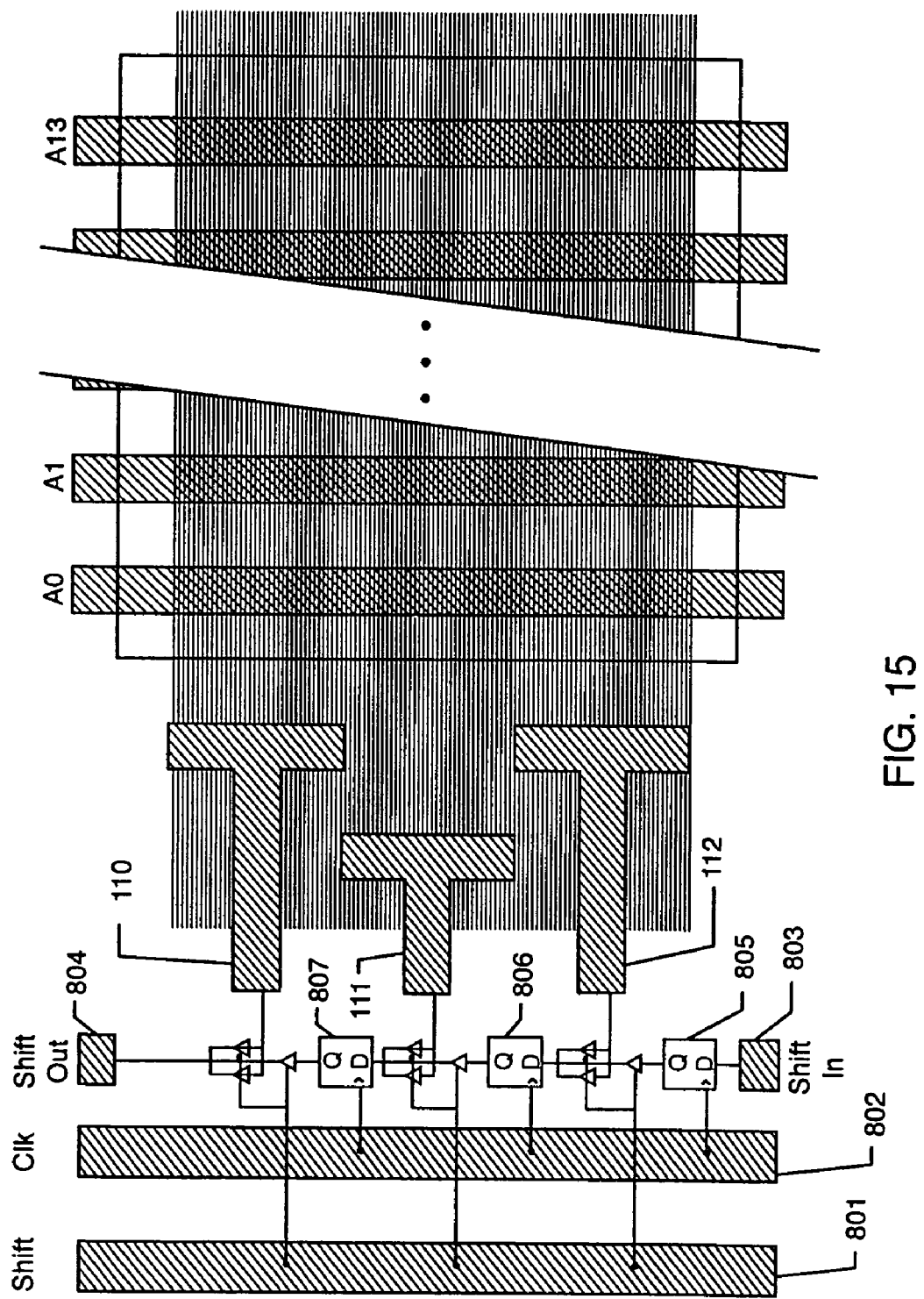

FIG. 15 shows a second embodiment for controlling staggered ohmic contacts, in case compact access to the decoder is more important than high-speed access. In this embodiment, only microscale wires 801-804 are needed. Microscale wire 801 carries the shift signal, microscale wire 802 carries the clock signal, microscale wire 803 carries the shift input signal, and microscale wire 804 carries the shift output signals. With a higher number of contacts, more time and a higher number of flip-flops are required, but not a higher number of microscale wires.

Also in the hybrid control case, control wires can either be microscale wires (as shown) or nanoscale wires.

One-dimensional Memory

The embodiment of FIG. 11 shows a two-dimensional memory. The present disclosure also provides a one-dimensional memory embodiment, using a single nanowire layer, as shown in FIG. 16.

Figure 13:
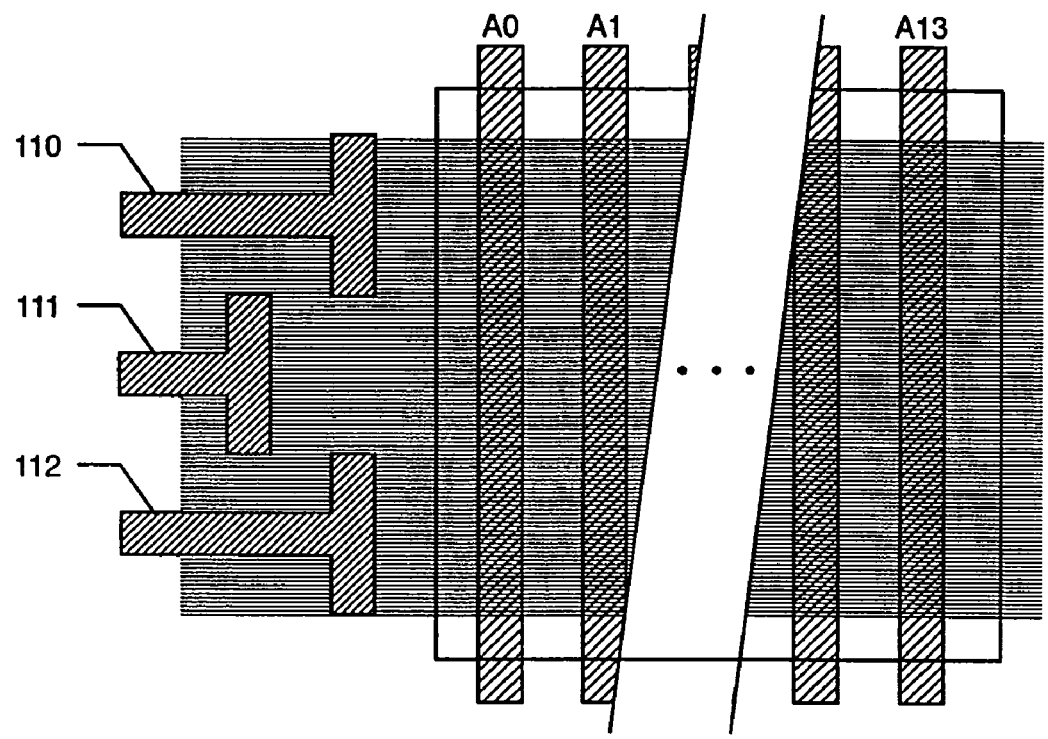
FIG. 13 shows a hybrid control memory arrangement with staggered ohmic contacts.
Figure 16:
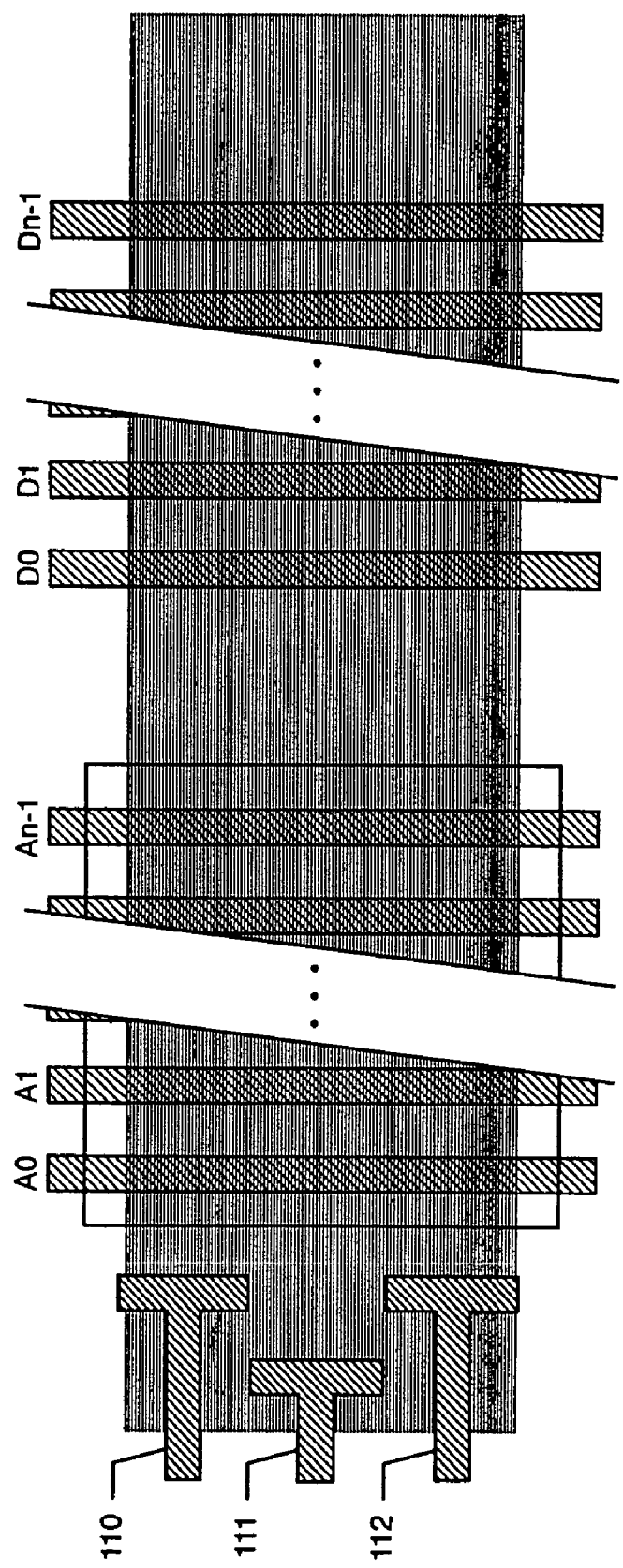
FIG. 16 shows a one-dimensional memory arrangement.

FIG. 16 is similar to FIG. 13, and shows staggered microscale wire contacts 110-112 energizing the endpoints of a collection of nanoscale wires, and address microscale wires A0-An-1. In addition, memory microscale wires D0-Dn-1 are provided.

Microscale wires D0-Dn-1 serve the same role as the vertical decoder 82 in the 2D-memory of FIG. 11. To perform a write, a suitable voltage is put on the wires D0-Dn-1, the appropriate ohmic group contact, and the A0-An-1 lines are used to select a single nanoscale wire and place a voltage on it. Therefore, a voltage differential between the selected nanoscale wire and the D0-Dn-1 lines will be established, allowing a crosspoint at the junction between the selected nanoscale line and the associated Di line to be programmed. A single Di line can be decoded and driven in the same way a standard, lithographic decoder is driven. In addition, since direct microscale control is present in the 1D case, multiple bits can be programmed to the same setting simultaneously. This is done by simply driving to the appropriate programming voltage multiple of the Di lines to be programmed and then program them all at once, similarly to the way multiple bits are written in a conventional memory. The differences from a conventional method of programming would include the fact the set of bits programmed must be to the same state and that, given suitable microscale control, any subset can be programmed. Therefore, with two write cycles (or m write cycles if a crosspoint has m states), any word D0 . . . Dn-1 can be programmed. In the first cycle, the entire word D0 . . . Dn-1 associated with the selected nanowire is written to one state (ON, for example). In the second cycle, all the bits which should be OFF are programmed into the OFF position.

Reading cycles have a similar behavior. Once only one of the Di's is driven to a 'high' value, and conduction in a single nanowire is enabled using the Ai's, the value associated with the Di, Ai crosspoint can be read on the ohmic contact output for each ohmic contact group.

Alternatively, multiple bits at a time can be read out. In particular, the 'high' value is driven into the associated ohmic contact group and through the Ai's onto a single nanoscale wire thus charging, through the programmed crosspoints, all of the Di's with associated, programmed crosspoints. In this way, the entire D0 . . . Dn-1 word will be read in one cycle. However, it will be slower per read operation, since the nanoscale connection will need to drive the capacitance of n microscale wires. The way the memory is run for the read operation will need to be decided during fabrication as it will determine the orientation of the diode rectification in the memory, i.e. from microscale Di's to nanoscale wires in the first case versus from nanoscale wires to microscale Di's in the second case.

Three-dimensional Memory

Figure 17:
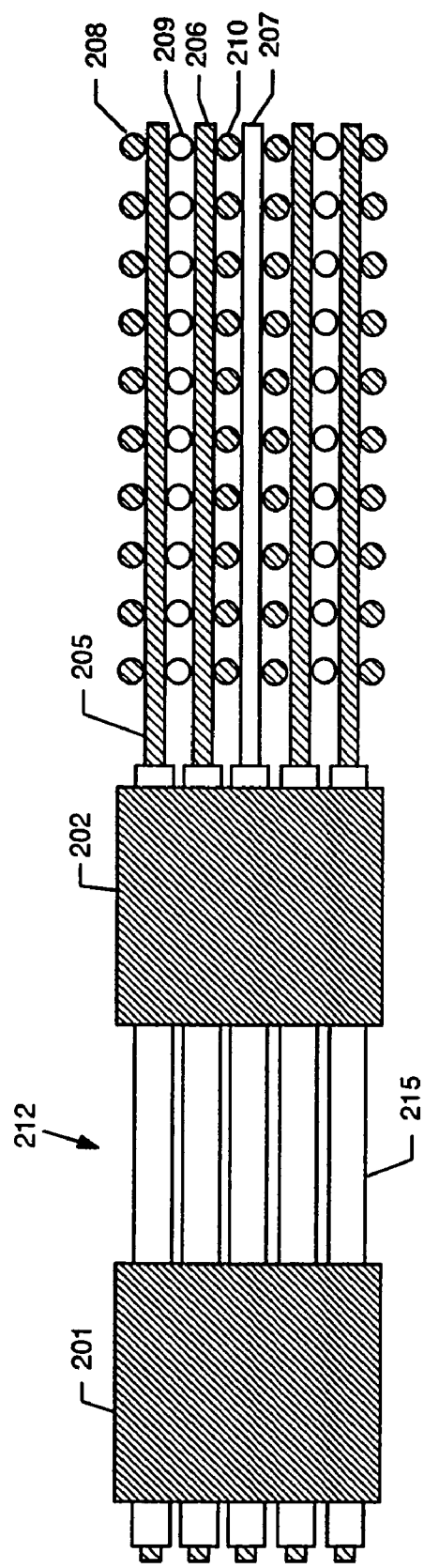
FIGS. 17 and 18 show a three-dimensional memory arrangement.
Figure 18:
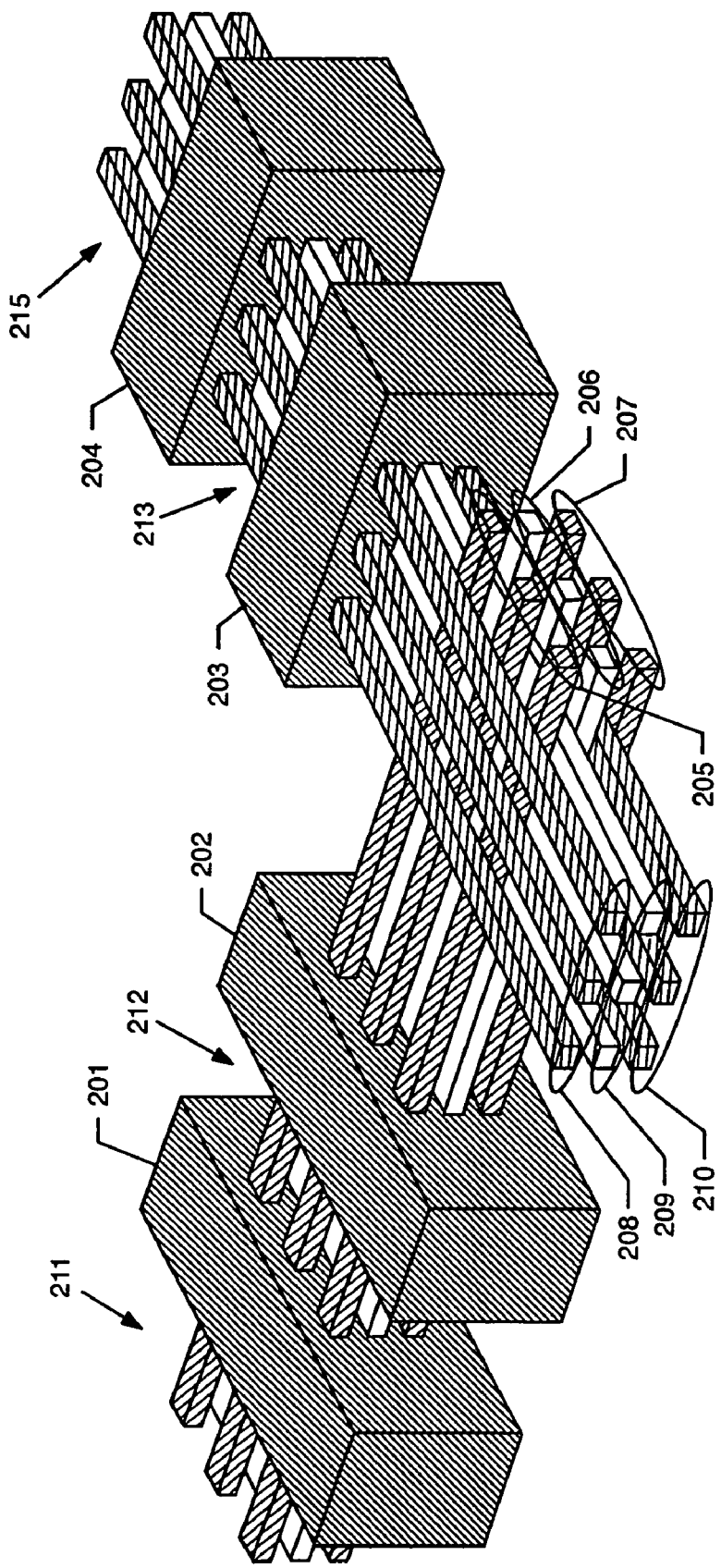

FIGS. 17 and 18 show a schematic cross-sectional view and a perspective view, respectively, of a 3D-memory embodiment. Microscale wires 201-204 are provided, together with a first set of layers 205-207 of nanoscale wires and a second, orthogonal, set of layers 208-210 of nanoscale wires. Similarly to the 2D embodiment in FIG. 11, the decoding regions for each layer are located in the regions 211-214. The nanoscale layers in the regions 211-214 are covered by an oxide sheath 215, to cover the modulation doped decode regions.

The interesting consequence of the 3D-memory embodiment is that microscale wires are shared by nanowires on different layers of the memory. Using the same stochastic selection techniques of the 2D case, a set of uniquely coded wires is assembled for each common group of microwire contacts, allowing each wire in a vertical plane to be uniquely selected.

In a preferred embodiment, like the one shown in FIG. 17, the layers of nanoscale wires are so arranged to define repeated occurrences of adjacent sets of layers comprising a first nanoscale layer 208, a second orthogonal nanoscale layer 205 defining memory locations in cooperation with the first nanoscale layer 208, and an insulating nanoscale layer 209.

Radial Modulation Doping

In addition to modulation doping along the axis of the nanoscale wire, also techniques for modulating the doping along the radius of a nanoscale wire are known, as disclosed in Lincoln J. Lauhon, Mark S. Gudiksen, Deli Wang and Charles M. Lieber, "Epitaxial core-shell and core-multishell nanowire heterostructures," Nature v420, pp 57-61, November 2002.

An interesting consequence of the radial modulation doping technique is that the nanoscale wire can both be radially and axially modulation doped. In particular, a predetermined section of a nanoscale wire can either be: 1) not doped; 2) axially doped; 3) radially doped; or 4) axially and radially doped. The memory shown in FIGS. 11-18 can use both modulation doping techniques for the nanoscale wires.

More specifically, the whole nanowire gets radially doped during construction. Later, after assembling the wires onto the substrate, the radial sleeve is selectively etched off from sections of the radially doped nanowire. In this way, nanowires that have a first set of portions which are axially and radially doped and nanowires that have a second set of portions that are only axially doped are obtained. Therefore, the first and second portions are advantageously determined after construction and after it has been determined how the nanowire will align with the lithographic substrate.

Nanoscale Wire Structure in the Memory Embodiment of FIG. 11

With reference to the vertical nanoscale wire, such as the nanoscale wire 72 shown in FIG. 11, several distinct regions can be observed:
a) a region to be ohmically connected to the microscale wire 77;
b) an address region which needs to be separated my means of an insulator (such as the insulator 83) from the microscale address lines CA0-CA3;
c) a core region containing information to be written or read, such as the region crossed by the horizontal nanoscale wires 61-66;
d) a controllable region which needs to be separated by means of an insulator from the microscale wire 85; and
e) a region to be ohmically connected to the microscale wire 79.

A similar observation can be done with reference to a horizontal nanoscale wire, such as the nanoscale wire 62.

It should be noted that only one of the two (orthogonal) wire sets in an array will need to be radially doped for the memory structure.

Fabrication Process in the Case of Axially Doped Nanoscale Wires

Figure 2:
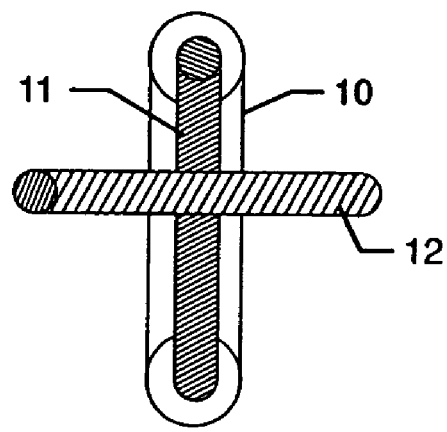
FIG. 2 shows a schematic perspective view of a prior art nanotube FET arrangement.
Figure 19:
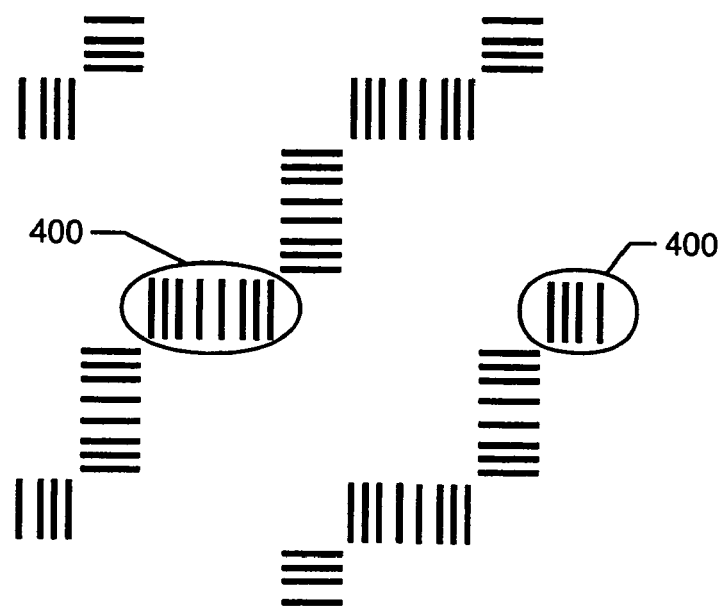
FIGS. 19-25 show different steps in a process for manufacturing a logic arrangement having microscale and nanoscale wires.
Figure 20:
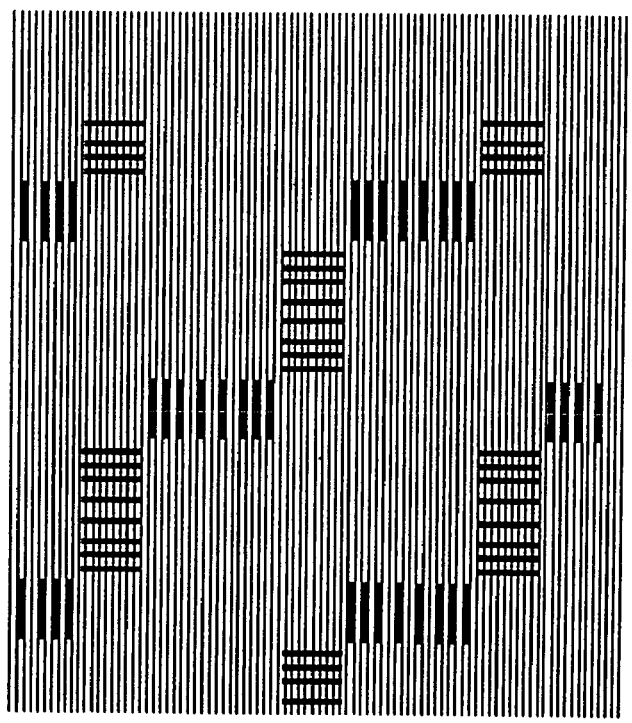
Figure 21:
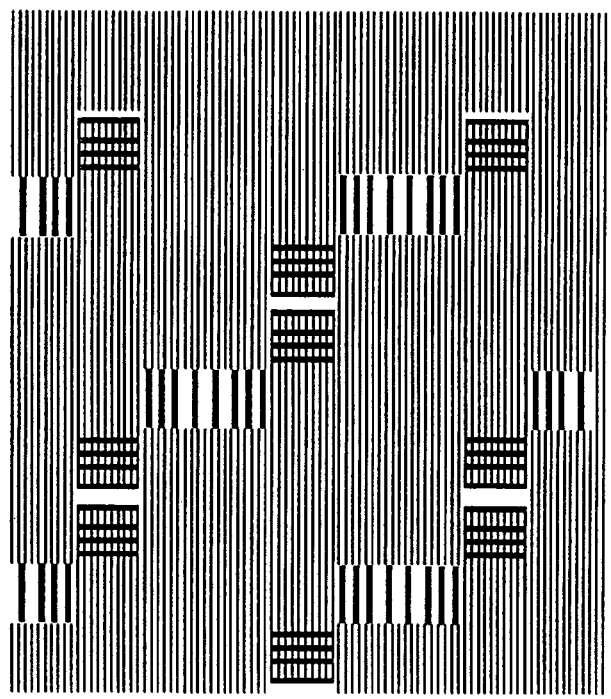
Figure 22:
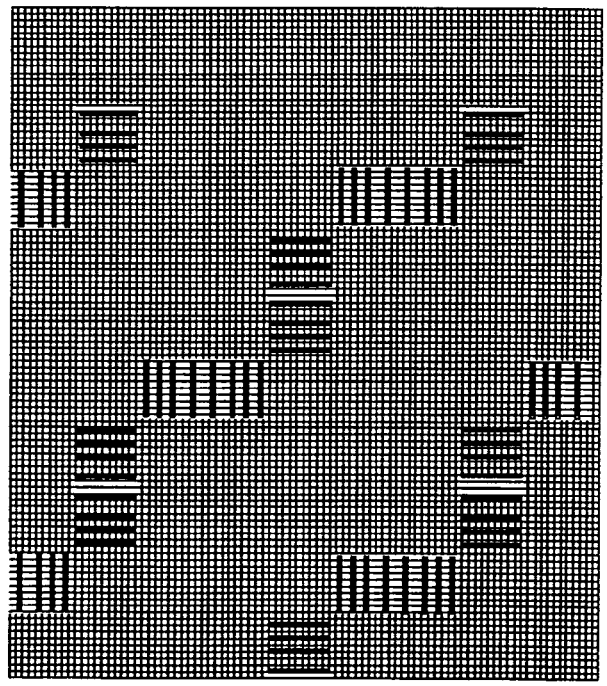

In the case of axially doped nanoscale wires, individual crosspoint junctions will be used for the memory core, as already explained above. A fabrication process for memories containing axially-doped nanoscale wires comprises the following steps:
1) Lithographically processing a silicon wafer to obtain a plurality of microscale wires.
2) Place oxide over the addressing portion of the microscale wires. FIG. 19 shows a possible disposition of the microwires after the first two steps of the fabrication process.
3) Mixing together a first set of axially-doped nanoscale wires. Mixing together of the nanoscale wires without causing contact between the nanoscale wires is obtained by growing an oxide layer, such as the oxide layer 10 in FIG. 2, around each nanoscale wire. The oxide layer prevents two nanoscale wires which are aligned parallel to each other from touching in their conduction regions (and hence shorting together) and acts as the oxide barrier allowing FET control rather than diode contact.
4) Aligning the first set of nanoscale wires and transferring the aligned first set above the microscale wires. FIG. 20 shows a possible chip state after the fourth step. Alignment of the nanoscale wires is obtained, for example, by means of a Langmuir-Blodgett flow (LB-flow) technique disclosed, for example, in Ulman A., "An introduction to ultrathin organic films: from Langmuir-Blodgett to self-assembly" Academic Press: New York, 1991, or Albrecht O., Matsuda H., Eguchi K., and Nakagiri T., "Construction and use of LB deposition machines for pilot production", Thin Solid Films, vol. 284/285 15 Sep. 1996, pp 152-156. LB-flow allows transfer of tight-packed, aligned nanoscale wires onto a surface.
5) Obtain breaks in the structure, perpendicular to the axis of alignment, by lithographic etching. FIG. 21 shows the fabrication state after the fifth step.
6) Mixing together a second set of axially-doped nanoscale wires.
7) Aligning the second set of nanoscale wires and transferring the aligned second set on the circuit, orthogonally to the first set of nanoscale wires, as shown in FIG. 22. Additionally, a molecular layer (not shown in the Figure) is placed between the orthogonal sets of nanowires. Such layer is disclosed, for example, in Christopher L. Brown and Ulrich Jonas and Jon A. Preece and Helmut Ringsdorf and Markus Seitz and J. Fraser Stoddart, "Introduction of [2]Catenanes into Langmuir Films and Langmuir-Blodgett Multilayers. A Possible Strategy for Molecular Information Storage Materials", Langmuir 16(4), 1924-1930, 2000.
8) Obtain breaks in the structure, perpendicular to the axis of alignment, by lithographic etching. See FIG. 23.
9) Filling metal over regions of ohmic contact, as shown in FIG. 24, thus obtaining the structure of FIG. 25.

Fabrication Process in the Case of Axially and Radially Doped Nanoscale Wires

In the case of nanoscale wires which are both axially and radially doped, the fabrication process is similar to process already described above, and reference can be made to already described FIGS. 19-25. However, there will be no need to place a molecular layer between the orthogonal sets of nanowires.

Following a first step such as the one shown in FIG. 19, where a disposition of microscale address wires 400 obtained by lithographically processing a silicon wafer is represented, two sets of nanoscale wires are grown. Differently from the previous embodiment, here the first set is axially modulation-doped and then radially modulation-doped on top of the axial coding, while the second set is axially coded only.

After mixing together the axially doped-only nanoscale wires, the mixed nanoscale wires are LB-flow aligned and then transferred to cover the silicon surface, as shown in FIG. 20. Further, desired breaks between subarrays perpendicular to the axis of alignment are lithographically etched, as shown in FIG. 21.

Figure 23:
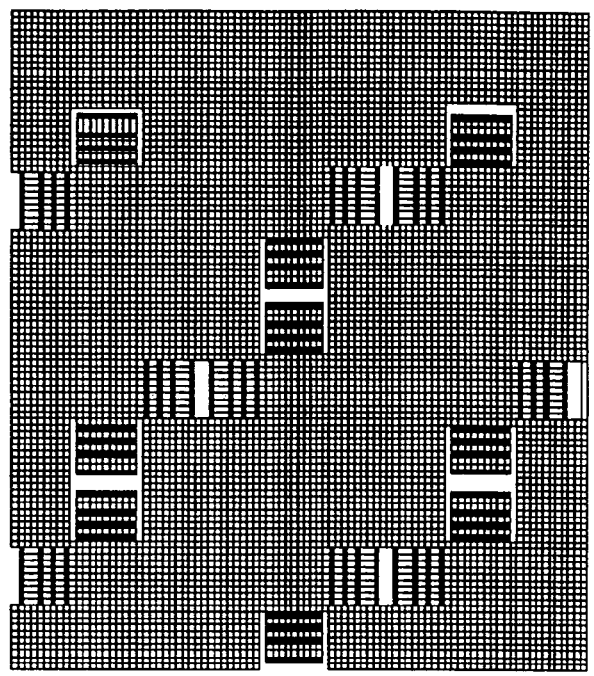
Figure 24:
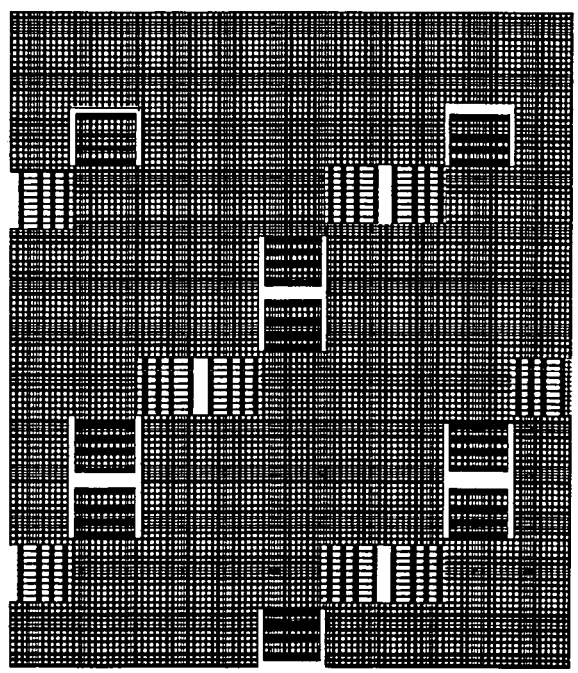

After mixing the set of axially and radially doped nanoscale wires, the mixed set is LB-flow aligned and transferred to cover the silicon surface, orthogonal to the other set, as shown in FIG. 22, and then desired breaks between subarrays are lithographically etched perpendicular to the axis of alignment, as shown in FIG. 23.

Differently from the previous embodiment, the present embodiment comprises a step where radial doping of tubes over the address window is etched away, as shown in FIG. 24. In particular, FIG. 24 shows a mask comprising address windows, i.e. windows corresponding to the address regions of the logic circuit to be built, such as the address regions 80 and 82 of FIG. 11. Only address windows containing radially doped nanoscale wires will be taken into consideration, and the radial doping of the nanoscale wires will be etched away in those regions, thus allowing addressing of the nanoscale wires as shown, for example, in FIG. 5 of the present application.

Figure 25:
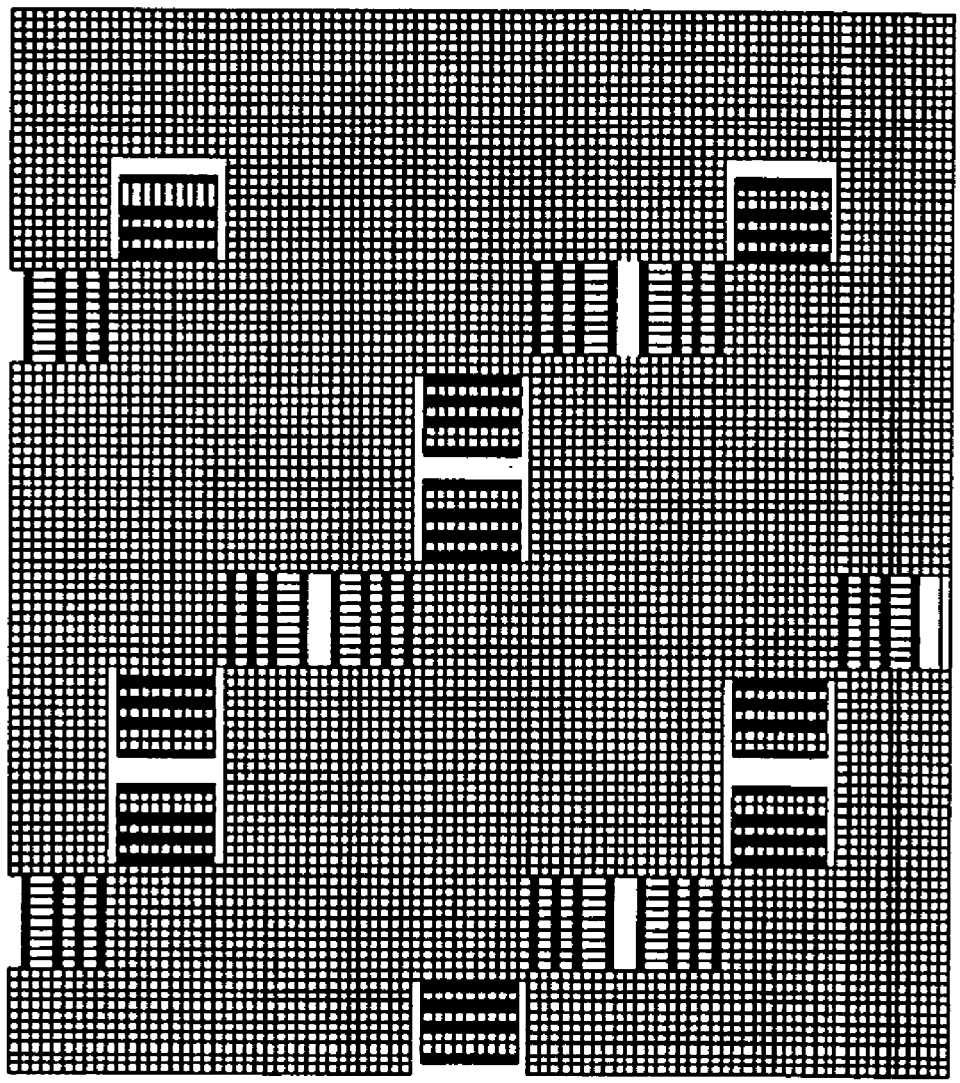

In a further step, metal is filled over regions of ohmic contact, as shown in FIG. 25.

Figure 1:
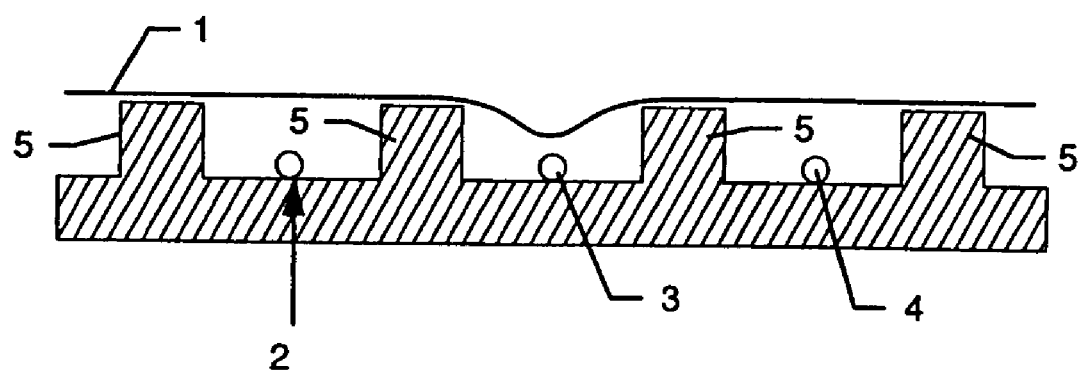
FIG. 1 shows a schematic cross-sectional view of a prior art nanotube-based programmable switchpoint.

In the present embodiment, there is no need for a separate device with hysteresis (e.g. some molecule) at the crosspoint, such as the suspended nanotube shown in FIG. 1, because the radial doping will allow information to be stored along the diameter of a predetermined section of the vertical nanoscale wires. Specifically, the radially modulation doped wire structure effectively includes a device with hysteresis.

A further embodiment can be provided, where both sets of wires are radially modulation doped.

k-Hot Rotation Groups

The method as disclosed in the present disclosure is based on two properties noted above, i.e.:
(1) a random bit-pitch misalignment of a repeat coded wire gives a rotation of the original code; and
(2) all rotations of a k-hot code are also k-hot codes.

In particular, due to the random alignment, the above two properties can be used to produce a single wire for each rotation group, thus reducing the number of unique nanowires needed.

For example, reference can be made to a 4-bit, 2-hot code, consisting of the codes 0011, 0110, 1100, 1001, 0101, and 1010. It can be noted that the 0011, 0110, 1100, and 1001 codes are simply rotations of each other. Similarly, the 0101 and 1010 codes are rotations of each other. Therefore, only two base rotation groups 0011 and 0101 are present. As a consequence, only wires with these two codes need to be coded up. Random misalignment will generate the remaining rotation codes and hence all six codes in the codespace.

It will be noted that the 0011 rotation group has a cardinality of four, while the 0101 rotation group has a cardinality of two. As a consequence, it is more likely to get replication of codes in the 0101 group than in the 0011 group, i.e. a non-uniform code probability is present.

According to an embodiment of the present disclosure, it is possible to omit degenerate rotation groups in order to promote uniform code probability selection. In other words, when the subgroups consist of different numbers of permutations, some of the subgroups are omitted from the subgroups from which a permutation within the subgroup is selected.

According to a further embodiment, the number of stochastically selected uniquely coded nanoscale wires can comprise a higher number of codes selected from rotation groups having a higher cardinality. In other words, the number of permutations of a code to be selected within a subgroup can depend on a comparison between the number of permutations within the given subgroup and the number of permutations within the remaining subgroups. For example, in the case shown above, two parts 0011 base codes could be mixed with one part 0101 base codes.

According to a still further embodiment a method is provided for calculating the number of distinct rotation groups, based on the following steps:
1) Generating a list of all uncovered code words for a given k-hot code
2) Picking a code from the list of uncovered codes as a new rotation base code
3) Generating all rotations of the current rotation base and removing the generated rotations of the current rotation base from the list
4) Repeating steps 2-3 until all the codes in the list have been covered Table 1 below summarizes results for n/2-hot codes up to n=14. It can be seen from Table 1 that the number of rotation groups is about 1/n the number of possible codes, thus allowing a sensible reuction in the number of uniquely coded nanoscale wires to be selected.

TABLE 1

| n | Codes | Number of rotation groups | Rotation group size |
|---|---|---|---|
| 2 | 2 | 1 | 2 × 1 |
| 4 | 6 | 2 | 4 × 1, 2 × 1 |
| 6 | 20 | 4 | 6 × 3, 2 × 1 |
| 8 | 70 | 10 | 8 × 8, 4 × 1, 2 × 1 |
| 10 | 252 | 26 | 10 × 25, 2 × 1 |
| 12 | 924 | 80 | 12 × 75, 6 × 3, 4 × 1, 2 × 1 |
| 14 | 3432 | 246 | 14 × 245, 2 × 1 |

Based on Table 1, a 6-hot, 12-bit code is comprised of 80 rotation groups which means that due to the random misalignment 80 nanoscale wires coded with rotation group codes are able to generate 924 codes. Similarly, for 7-hot, 14-bit code 246 nanoscale wires coded with rotation group codes are able to generate 3432 codes.

According to another embodiment, a method is provided for coding nanoscale wires with codes of distinct rotation groups, based on the following steps:
1) Providing a plurality of nanoscale wires, each nanoscale wire comprising a number n of potentially controllable regions axially distributed along the nanoscale wire. For example, for a 4-bit, 2-hot code n=4.
2) Selecting a number k<n of regions to be controlled within the number n of potentially controllable regions. For a 4-bit, 2-hot code k=2
3) Generating a group comprising permutations of the k regions to be controlled. For a 4-bit, 2-hot code the group comprises the following permutations of the k regions: 1100, 0110, 0011, 1001, 0101, 1010.
4) Dividing the group in subgroups, each subgroup consisting of permutations of the k regions which are a rotation of each other, so that all permutations of a given subgroup can be obtained by rotation of any one of the permutations of the given subgroup. The 4-bit, 2-hot code contains the following two subgroups which are a rotation of each other: a) 1100, 0110, 0011, 1001 and b) 0101, 1010
5) For each subgroup, selecting a permutation within the subgroup, wherein the selected permutations are different therebetween and represent different codings. For a 4-bit, 2-hot code the two permutations could be any combination of the codes within the two subgroups, for example 1100 and 0101 codes could be chosen.
6) Applying the selected permutations to the plurality of nanoscale wires. For a 4-bit, 2-hot code the nanoscale wires could, for example, be coded with the 1100 and 0101 codes.

In summary, also methods for obtaining codes to be implemented in coding nanoscale wires are disclosed. The methods disclosed teach how to code a reduced number of nanoscale wires through the use of rotation group codes. The methods further teach how to generate different code permutations through random misalignment and how to promote uniform code probability selection.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

What is claimed is:

1. A method to code nanoscale wires, comprising:
providing a plurality of nanoscale wires, each nanoscale wire comprising a number n of potentially controllable regions axially distributed along the nanoscale wire;
selecting a number $k < n$ of regions to be controlled within the number n of potentially controllable regions;
generating a group comprising permutations of the k regions to be controlled;
dividing the group in subgroups, each subgroup consisting of permutations of the k regions which are a rotation of each other, so that all permutations of a given subgroup can be obtained by rotation of any one of the permutations of the given subgroup; and
for each subgroup, selecting a permutation within the subgroup, wherein the selected permutations are different therebetween and represent different codings; and
using the selected permutations to code the plurality of nanoscale wires,
wherein codes corresponding to permutations not selected within the subgroup are generated by means of random misalignment in the nanoscale wires coded with permutations which are a rotation of the non-selected permutations.

2. The method of claim 1, wherein, when the subgroups consist of different numbers of permutations, some of the subgroups are omitted from the subgroups from which a permutation within the subgroup is selected, in order to promote uniform code probability selection.

3. The method of claim 1, wherein, for a given subgroup, a number of permutations within the subgroup is selected which depends on a comparison between the number of permutations within the given subgroup and the number of permutations within the remaining subgroups.

4. The method of claim 1, wherein $k=n/2$.

5. A method to code nanoscale wires, comprising:
providing a plurality of nanoscale wires, each nanoscale wire comprising a number n of potentially controllable regions axially distributed along the nanoscale wire;
selecting a number $k<n$ of regions to be controlled within the number n of potentially controllable regions;
generating a first group comprising permutations of the k regions to be controlled;
selecting a first permutation within the first group;
determining, within remaining permutations of the first group, which are the remaining permutations which can be obtained by rotation of the selected permutation;
eliminating from the first group the selected permutation and the determined permutations, thus forming a second group;
performing, on the second group, the same operations performed on the first group, thus selecting a second permutation and forming a third group; and
repeating actions of selecting, determining and eliminating, until no further permutations can be selected, wherein the selected permutations are different therebetween and represent different codings; and
using the selected permutations to code the plurality of nanoscale wires,
wherein codes corresponding to permutations which have been eliminated are generated by means of random misalignment in the nanoscale wires coded with permutations selected from the same group of the eliminated permutations.

6. The method of claim 5, wherein $k =n/2$.

* * * * *